United States Patent
Joardar

(10) Patent No.: US 10,693,414 B2
(45) Date of Patent: Jun. 23, 2020

(54) METHOD AND APPARATUS FOR A SOLAR PANEL

(71) Applicant: Tiasha Joardar, Plano, TX (US)

(72) Inventor: Tiasha Joardar, Plano, TX (US)

(*) Notice: Subject to any disclaimer, the term of this patent is extended or adjusted under 35 U.S.C. 154(b) by 161 days.

(21) Appl. No.: 15/890,183

(22) Filed: Feb. 6, 2018

(65) Prior Publication Data

US 2018/0342979 A1  Nov. 29, 2018

Related U.S. Application Data

(63) Continuation of application No. 15/604,306, filed on May 24, 2017, now Pat. No. 10,581,376.

(51) Int. Cl.
| | |
|---|---|
| *H02S 40/42* | (2014.01) |
| *H02J 3/14* | (2006.01) |
| *H02J 3/46* | (2006.01) |
| *H02J 3/38* | (2006.01) |
| *H01L 35/28* | (2006.01) |
| *H02S 40/30* | (2014.01) |
| *H02S 50/00* | (2014.01) |

(52) U.S. Cl.
CPC .......... *H02S 40/42* (2014.12); *H01L 35/28* (2013.01); *H02J 3/14* (2013.01); *H02J 3/38* (2013.01); *H02J 3/383* (2013.01); *H02J 3/46* (2013.01); *H02S 40/30* (2014.12); *H02S 50/00* (2013.01)

(58) Field of Classification Search
CPC .......... H02S 40/42; H02S 50/00; H02S 40/30; H01L 35/28; H02J 3/383; H02J 3/46; H02J 3/14
See application file for complete search history.

(56) References Cited

U.S. PATENT DOCUMENTS

| | | | | |
|---|---|---|---|---|
| 7,849,698 B2* | 12/2010 | Harrod | .................... | F25B 13/00 62/127 |
| 8,646,281 B2 | 2/2014 | Lim | | |
| 8,667,806 B2 | 3/2014 | Sinha | | |
| 8,860,241 B2* | 10/2014 | Hadar | .................... | H04B 3/548 307/1 |
| 9,810,442 B2* | 11/2017 | Matsuoka | .......... | G05D 23/1904 |
| 10,139,846 B2* | 11/2018 | Motsenbocker | .......... | G05F 1/67 |
| 10,151,506 B2* | 12/2018 | Kolk | ....................... | F24F 11/61 |
| 10,218,307 B2* | 2/2019 | Alon | ....................... | H02S 40/34 |
| 2002/0074034 A1 | 6/2002 | Fujisaki et al. | | |

(Continued)

*Primary Examiner* — Michael C Zarroli
(74) *Attorney, Agent, or Firm* — Ariel S. Bentolila; Bay Area IP Group, LLC

(57) ABSTRACT

A system comprises a smart hybrid solar panel that employs a self-powered adaptive temperature control. Active temperature regulation may be implemented using a heat pump such as, and without limitations, thermoelectric (TE) cooling modules and a switching circuit with variable duty cycle that periodically diverts the photovoltaic solar cell's output to the heat pump. A smart software defined control system may algorithmically adjust the switching duty cycle to maximize the net power output of the panel based on a variety of sensory inputs and/or algorithms. The variety of sensory inputs may include weather forecast information, internal panel temperature, ambient air temperature, panel output voltage and current and humidity. The photovoltaic solar cells and heat pump may be mechanically integrated.

14 Claims, 17 Drawing Sheets

(56) References Cited

U.S. PATENT DOCUMENTS

| | | | | |
|---|---|---|---|---|
| 2014/0321839 A1* | 10/2014 | Armstrong | .......... | F24D 19/1063 |
| | | | | 392/463 |
| 2015/0277410 A1* | 10/2015 | Gupta | ..................... | H02J 3/008 |
| | | | | 700/295 |
| 2017/0012435 A1* | 1/2017 | Arditi | ............... | H01L 31/02021 |
| 2018/0029483 A1* | 2/2018 | Del Core | ................ | B60L 58/40 |

* cited by examiner

900

```
dT = cellTemp - airTemp;
  if (dT > 8) {
    PORTB = 0b00010000;
    dutyCycle = 0.92;
  }
  else {
    if (dT > 6) {
      PORTB = 0b00001000;
      dutyCycle = 0.94;
    }
    else {
      if (dT > 4) {
        PORTB = 0b00000100;
        dutyCycle = 0.96;
      }
      else {
        if (dT > 2) {
          PORTB = 0b00000010;
          dutyCycle = 0.98;
        }
        else {.....
```

FIG. 9

METHOD AND APPARATUS FOR A SOLAR PANEL

CROSS-REFERENCE TO RELATED APPLICATIONS

The present Utility patent application claims priority benefit of the U.S. provisional application for patent Ser. No. 15/604,306 entitled "METHOD AND APPARATUS FOR A SOLAR PANEL", filed on 24 May 2017 under 35 U.S.C. 119(e). The contents of this related provisional application are incorporated herein by reference for all purposes to the extent that such subject matter is not inconsistent herewith or limiting hereof.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

FIELD OF THE INVENTION

One or more embodiments of the invention generally relate to increasing the power output of solar panels. More particularly, certain embodiments of the invention relate to increasing the net power output of a photovoltaic (PV) solar panel while mitigating the increase in temperature of the solar panels.

BACKGROUND OF THE RELEVANT PRIOR ART

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

One of the chronic problems related to photovoltaic solar energy may be the increase in internal temperature of solar panels under continuous exposure to sunlight. Typically, the panel internal temperature rise may be in the range of 20° C. to 40° C. above an ambient temperature. This increase in temperature may lead to a loss of power output capability, i.e., the efficiency of the panel. It may be commonly accepted that the peak power output of high quality silicon solar panels drops about 0.5% per degree Celsius increase in temperature. It may be seen that solar panels may lose up to 20% of their rated power output capability due to natural heating under sunlight. If this loss of power output may be eliminated or reduced, a decrease in the cost per watt of electricity generated may result, which may make solar energy more commercially viable. In addition, the constant daily temperature cycling reduces the serviceable lifetime of solar panels.

Currently, methods to mitigate these problems have included the use of active heat removal methods such as forced air or water cooling, or thermoelectric cooling. These methods appear to have limited success because the methods may result in reducing net power output, increasing system cost and complexity, and/or degrading the overall system reliability.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIG. 9 illustrates an exemplary embodiment of a section of c code for programming microcontroller for automatically adjusting duty cycle, and thereby the PV Cell temperature, under varying atmospheric conditions; and, FIG. 10 illustrates a block diagram of an apparatus that may be a portion of a smart hybrid solar panel, in according with some embodiments.

Figure 1:
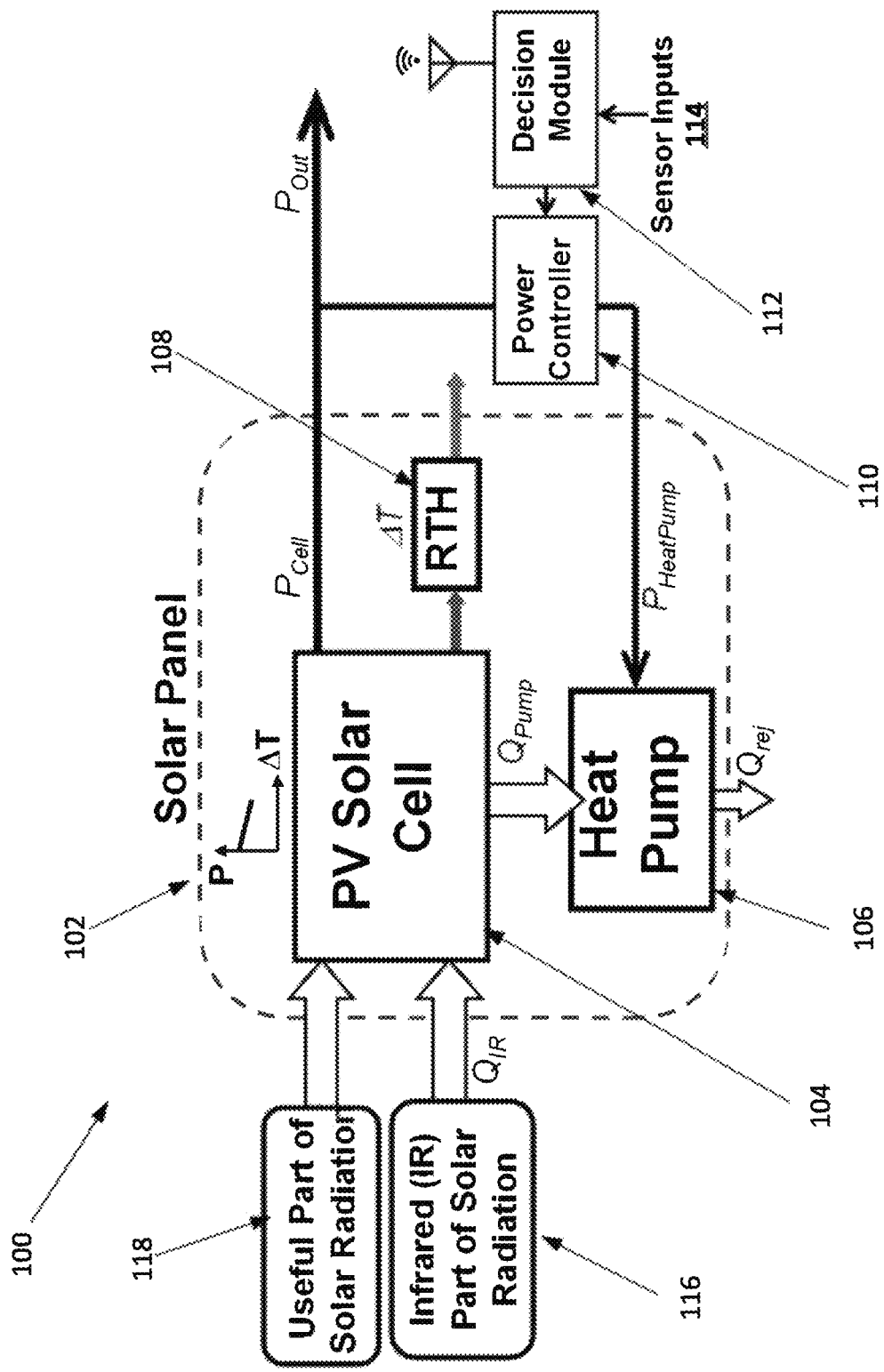
FIG. 1 illustrates an exemplary embodiment of a self-cooled photovoltaic solar panel structure formed by integrating a heat pump with the panel.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settle law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forward most point of the upper or outsole and the rearward most point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" includes the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

TERMINOLOGY

The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of" where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, a system on a chip, or a chip set; a data acquisition device; an optical computer; a quantum computer; a biological computer; and generally, an apparatus that may accept data, process data according to one or more stored software programs, generate results, and typically include input, output, storage, arithmetic, logic, and control units.

Those of skill in the art will appreciate that where appropriate, some embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Where appropriate, embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

"Software" may refer to prescribed rules to operate a computer. Examples of software may include: code segments in one or more computer-readable languages; graphical and or/textual instructions; applets; pre-compiled code; interpreted code; compiled code; and computer programs.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software program code for carrying out operations for aspects of the present invention can be written in any combination of one or more suitable programming languages, including an object oriented programming languages and/or conventional procedural programming languages, and/or programming languages such as, for example, Hyper text Markup Language (HTML), Dynamic HTML, Extensible Markup Language (XML), Extensible Stylesheet Language (XSL), Document Style Semantics and Specification Language (DSSSL), Cascading Style Sheets (CSS), Synchronized Multimedia Integration Language (SMIL), Wireless Markup Language (WML), Java™, Jini™, C, C++, Smalltalk, Perl, UNIX Shell, Visual Basic or Visual Basic Script, Virtual Reality Markup Language (VRML), ColdFusion™ or other compilers, assemblers, interpreters or other computer languages or platforms.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

A network is a collection of links and nodes (e.g., multiple computers and/or other devices connected together) arranged so that information may be passed from one part of the network to another over multiple links and through various nodes. Examples of networks include the Internet, the public switched telephone network, the global Telex network, computer networks (e.g., an intranet, an extranet, a local-area network, or a wide-area network), wired networks, and wireless networks.

The Internet is a worldwide network of computers and computer networks arranged to allow the easy and robust exchange of information between computer users. Hundreds of millions of people around the world have access to computers connected to the Internet via Internet Service Providers (ISPs). Content providers (e.g., website owners or operators) place multimedia information (e.g., text, graphics, audio, video, animation, and other forms of data) at specific locations on the Internet referred to as webpages. Websites comprise a collection of connected, or otherwise related, webpages. The combination of all the websites and their corresponding webpages on the Internet is generally known as the World Wide Web (WWW) or simply the Web.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

It will be readily apparent that the various methods and algorithms described herein may be implemented by, e.g., appropriately programmed general purpose computers and computing devices. Typically a processor (e.g., a microprocessor) will receive instructions from a memory or like device, and execute those instructions, thereby performing a process defined by those instructions. Further, programs that implement such methods and algorithms may be stored and transmitted using a variety of known media.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

The functionality and/or the features of a device may be alternatively embodied by one or more other devices which are not explicitly described as having such functionality/features. Thus, other embodiments of the present invention need not include the device itself.

The term "computer-readable medium" as used herein refers to any medium that participates in providing data (e.g., instructions) which may be read by a computer, a processor or a like device. Such a medium may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, removable media, flash memory, a "memory stick", any other memory chip or cartridge, a carrier wave as described hereinafter, or any other medium from which a computer can read.

Various forms of computer readable media may be involved in carrying sequences of instructions to a processor. For example, sequences of instruction (i) may be delivered from RAM to a processor, (ii) may be carried over a wireless transmission medium, and/or (iii) may be formatted according to numerous formats, standards or protocols, such as Bluetooth, TDMA, CDMA, 3G.

Where databases are described, it will be understood by one of ordinary skill in the art that (i) alternative database structures to those described may be readily employed, (ii) other memory structures besides databases may be readily employed. Any schematic illustrations and accompanying descriptions of any sample databases presented herein are exemplary arrangements for stored representations of information. Any number of other arrangements may be employed besides those suggested by the tables shown. Similarly, any illustrated entries of the databases represent exemplary information only; those skilled in the art will understand that the number and content of the entries can be different from those illustrated herein. Further, despite any depiction of the databases as tables, an object-based model could be used to store and manipulate the data types of the present invention and likewise, object methods or behaviors can be used to implement the processes of the present invention.

A "computer system" may refer to a system having one or more computers, where each computer may include a computer-readable medium embodying software to operate the computer or one or more of its components. Examples of a computer system may include: a distributed computer system for processing information via computer systems linked by a network; two or more computer systems connected together via a network for transmitting and/or receiving information between the computer systems; a computer system including two or more processors within a single computer; and one or more apparatuses and/or one or more systems that may accept data, may process data in accordance with one or more stored software programs, may generate results, and typically may include input, output, storage, arithmetic, logic, and control units.

Embodiments of the invention may also be implemented in one or a combination of hardware, firmware, and software. They may be implemented as instructions stored on a machine-readable medium, which may be read and executed by a computing platform to perform the operations described herein.

More specifically, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In the following description and claims, the terms "computer program medium" and "computer readable medium" may be used to generally refer to media such as, but not limited to, removable storage drives, a hard disk installed in hard disk drive, and the like. These computer program products may provide software to a computer system. Embodiments of the invention may be directed to such computer program products.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments within the scope of the present disclosure may also include tangible and/or non-transitory computer-readable storage media for carrying or having computer-executable instructions or data structures stored thereon. Such non-transitory computer-readable storage media can be any available media that can be accessed by a general purpose or special purpose computer, including the functional design of any special purpose processor as discussed above. By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

While a non-transitory computer readable medium includes, but is not limited to, a hard drive, compact disc, flash memory, volatile memory, random access memory, magnetic memory, optical memory, semiconductor based memory, phase change memory, optical memory, periodically refreshed memory, and the like; the non-transitory computer readable medium, however, does not include a pure transitory signal per se; i.e., where the medium itself is transitory.

One or more embodiments of the present invention will next be described in some detail with reference to technologies and features incorporated in the exemplary embodiments of a photovoltaic (PV) solar panel, as illustrated in FIGS. 1-5. Subsequent paragraphs will describe a software defined controller unit for adaptively self-cooled PV solar panels, as illustrated in FIGS. 6-9.

The present embodiment may provide solutions for increasing the net power output of a PV solar panel by using an optimum fraction of the panel's own power to keep its temperature from increasing above ambient air temperature. A fundamental reason for the increase in the internal temperature of a solar panel may be the absorption of infrared radiation present in sunlight by the panel. The energy present in the infrared radiation cannot be converted to electricity. Instead, as it may be conducted through the panel, the panel's effective thermal resistance may cause its internal temperature to rise. If this infrared content may be efficiently pumped away, the problem of panel temperature rise and power loss may be mitigated.

While various types of heat pumps may be employed to control the panel temperature, a point to be considered may be the energy usage of the heat pump itself. Those skilled in the art, in light of the present teachings, will readily recognize that if the heat pump consumes more energy in the process of removing infrared radiation from the panel than the increase in energy resulting from maintaining the panel at a lower temperature, then there may be little net improvement in the total power generated by the system. In fact, in such an event, it may be more cost effective to not cool the panel.

A second impediment in solar panel cooling schemes may be the logistics of powering the heat pumps. Generally, an external power source may be required. This configuration may increase system cost and complexity, and may be particularly problematic in remote installations that lack an easy access to external power sources.

Some embodiments of the present invention may provide solutions to address both problems described above. The conceptual ideas behind the techniques for these solutions are described below.

In order to remove heat, a heat pump may be employed to consume energy. The efficiency of a heat pump may be measured as a ratio of the amount of heat energy per unit time it removes to the amount of energy (typically electric energy) per unit time it consumes in doing so. This ratio may be commonly referred to as the Coefficient of Performance (COP). With a higher the COP, the heat pump may be more efficient.

In a hypothetical situation, consider a typical value of COP that maybe required of a heat pump in order to be a cost effective means of improving solar panel performance. Using previously stated assumptions of 20° C. increase in internal temperature of a panel, a 0.5% drop in power output per degree increase in temperature, a 20% efficiency solar cell, and 100 mW/cm2 of incoming solar radiation, the panel may lose about 2 mW/cm2 due to the increase in its internal temperature over ambient temperature.

Assuming further that about 40% of the incoming solar radiation may be infrared and may contribute to heating the panel, it may be estimated that a COP of about 20 may be required. Achieving this value may be a challenge. Indeed, from a perspective of refrigeration, the application where heat pumps may be typically employed, such high COP values may not be practically attainable. Under some constraining conditions, the COP may be dramatically increased. A consideration may be the heat load, i.e., the amount of heat energy the heat pump may expected to remove. COP may be a strong function of the heat load, increasing rapidly as the heat load decreases. The reason for this characteristic may be most conveniently understood for a thermoelectric (TE) heat pump. By way of an example, and without limitations, a TE heat pump may require a certain amount of electric current (I) to handle a given heat load. As the electrical current flows through the heat pump, it may generate heat due to resistive effects. The self-generated heat may be proportional to the square of the electric current and may add to the burden on the heat pump, ultimately reducing the amount of useful heat removal and therefore lowering the COP. Similar considerations may also apply to other types of heat pumps.

Under low heat loads, the COP may increase exponentially. This assumption may be a factor supporting the present embodiment. Those skilled in the art, in light of the present teaching, may readily recognize that the heat load a solar panel is subjected to under natural sunlight may be low; for example, and without limitations, on the order of about 40 mW/cm$^2$. The heat load may arise mostly due to the infrared content in the solar spectrum. By extension, it may also be understandable, by one skilled in the art, in light of the present teaching, that the possibility of attaining the required high heat pump COP diminishes if the solar panel may be subjected to concentrated sunlight, e.g. by placement under an optical lens. Another consideration may be the temperature differential between the hot and cold sides of the heat pump. From fundamental thermodynamic principles, the maximum theoretically attainable COP of a heat pump is inversely proportional to the temperature difference between the hot and cold sides of the heat pump. This principle may be understood using a TE heat pump as an example, and without limitations. For large differences in temperature between the hot and cold sides of a TE cooling module, heat energy may flow back into the cold side conductively through the module itself, increasing the heat burden and thereby may lower the COP.

Furthermore, for TE heat pumps, the theoretical maximum COP is given by the expression:

$$COP_{max} = \left[\frac{T_C}{T_H - T_C}\right]\left(\frac{\sqrt{ZT+1} - \frac{T_H}{T_C}}{\sqrt{ZT+1} + 1}\right)$$

where TH is the hot side temperature and TC is the cold side temperature in Kelvin (degrees Celsius+273). From this equation it may be observed that if TH and TC are almost equal, then very high COP may be possible. This point constitutes the second factor supporting the present embodiment. By constraining the panel temperature to be close to the external air temperature, the possibility of attaining a high heat pump COP may be markedly enhanced.

The logistical complexity of having to operate the heat pump using external power sources may be resolved in the present embodiment by using a unique time-division technique that allows the panel's own power to be utilized in energizing the heat pump. An added advantage of this technique may be that there may not be an increase of the panel area requirement (e.g. as may happen if the heat pump were energized using separate dedicated solar panels). This point may be a factor in keeping the overall cost of solar energy low, given that high indirect costs associated with total panel area may be one of the reasons for the relatively high cost of solar energy compared to energy obtained from fossil fuels.

The features incorporated in the present embodiment are described below:

(a) A photovoltaic solar panel whose temperature may be controlled using an active heat pump (such as, and without limitations, a plurality of thermoelectric cooling modules, aka Peltier cooling modules) which may be mechanically integrated with the panel and powered by the panel itself (i.e., an external power source may not be required).

(b) The configuration employed in the mechanical integration of the heat pump with the solar panel may include: the active heat pump consisting of an electrically and thermally conductive heat spreader layer placed under the solar cell, followed by a single or multiple layers of thermoelectric cooling modules placed under this heat spreader, followed by an active or passive heat sink under the thermoelectric modules. The entire assembly may be enclosed in a thermally insulating material to prevent or minimizing heat leakage through the sides.

(c) A time-division based switching system that may periodically diverts the solar cell's electrical power output to the heat pump from the load, with adjustable duty cycle.

(d) A smart, software defined control mechanism that may determine the optimal duty-cycle needed to maximize the net power output of the solar panel, using a variety of sensory inputs.

(e) The networking of the control electronics that may allow connectivity with the worldwide web and access to weather forecast information thereby allowing predictive control of the panel's performance.

An embodiment of the present invention will now be described in detail for features (a), (b) and (c), as noted above, with reference to embodiments thereof as illustrated in the accompanying drawings, FIGS. 1-5.

FIG. 1 illustrates an exemplary embodiment 100 of a self-cooled solar power system comprising solar panel 102 that comprises photovoltaic solar cells (PV cells). By way of example, and without limitations, PV cells may be specialized semiconductor diodes that may convert visible light into direct current (DC). Solar panel 102 may be formed by integrating a heat pump 106 and photovoltaic (PV) solar cell 104 in solar panel 102. As illustrated in the graph on FIG. 1, the power (P) of solar panel 102 may decline with a greater differential in temperature ($\Delta T$) between the hot side and cold side of heat pump 106. This temperature differential is essentially the same as the difference between the internal temperature of the solar panel and the ambient air temperature. Inputs to PV solar Cell 104 may include (1) a useful part of solar radiation 118 and (2) an infrared (IR) part of solar radiation 116, represented by $Q_{IR}$. A portion of $Q_{IR}$ denoted as $Q_{Pump}$ may be coupled to heat pump 106. PV solar cell 104 may generate solar power signal, $P_{Cell}$, resulting in the solar cell power output, $P_{Out}$. Solar panel 102's effective thermal resistance (RTH) 108 may be also illustrated in FIG. 1. The portion of $Q_{IR}$ not coupled to heat pump 106 may flow through RTH, increasing temperature differential $\Delta T$. A decision module 112 may receive sensors inputs 114 and may provide control information, without limitation, such as a control signal to power controller 110. As illustrated, decision module 112 may be capable of transmitting and receiving wireless signals. The power controller 110 also may receive solar power signal, $P_{Cell}$. Based on solar power signal $P_{Cell}$ and the control information from decision module 112, power controller 110 may generate signal $P_{HeatPump}$ that may be coupled to heat pump 106. Based on $Q_{Pump}$ and $P_{HeatPump}$P, heat pump 106 may generate an output representing the rejected power Qrej which may reduce temperature differential $\Delta T$.

Exemplary embodiment 100 may maintain PV solar cell 104 at or near ambient air temperature (or external temperature) by diverting an optimal fraction of its own output power to heat pump 106. Without heat pump 106, the infrared (IR) part of solar radiation 116 in the incident sunlight may flow through solar panel 102's effective thermal resistance (RTH) 108 may cause a large increase in temperature inside solar panel 102. By way of an example, and without limitations, some novel aspects of the present embodiment lie in the physical construction of the solar panel 102 and the methods employed by the decision module 112 and power controller 110 to divert an optimum amount of power from the PV solar cell 104 to the heat pump 106 such that the net power delivered to the load may be maximized.

Decision module 112 may be designed to maximize or minimize certain objective functions such as, and without limitations, the net power output of the panel, difference between panel internal temperature and external air temperature, etc. One particularly useful function may be the cost per watt (CPW) of electricity generated. This function may require programming several factors that may determine the CPW and also may determine sensitivity with respect to the optimizable variables such as, and without limitations, the duty-cycle. This function may represent a high commercial feasibility point of a PV solar installation.

Figure 2A:
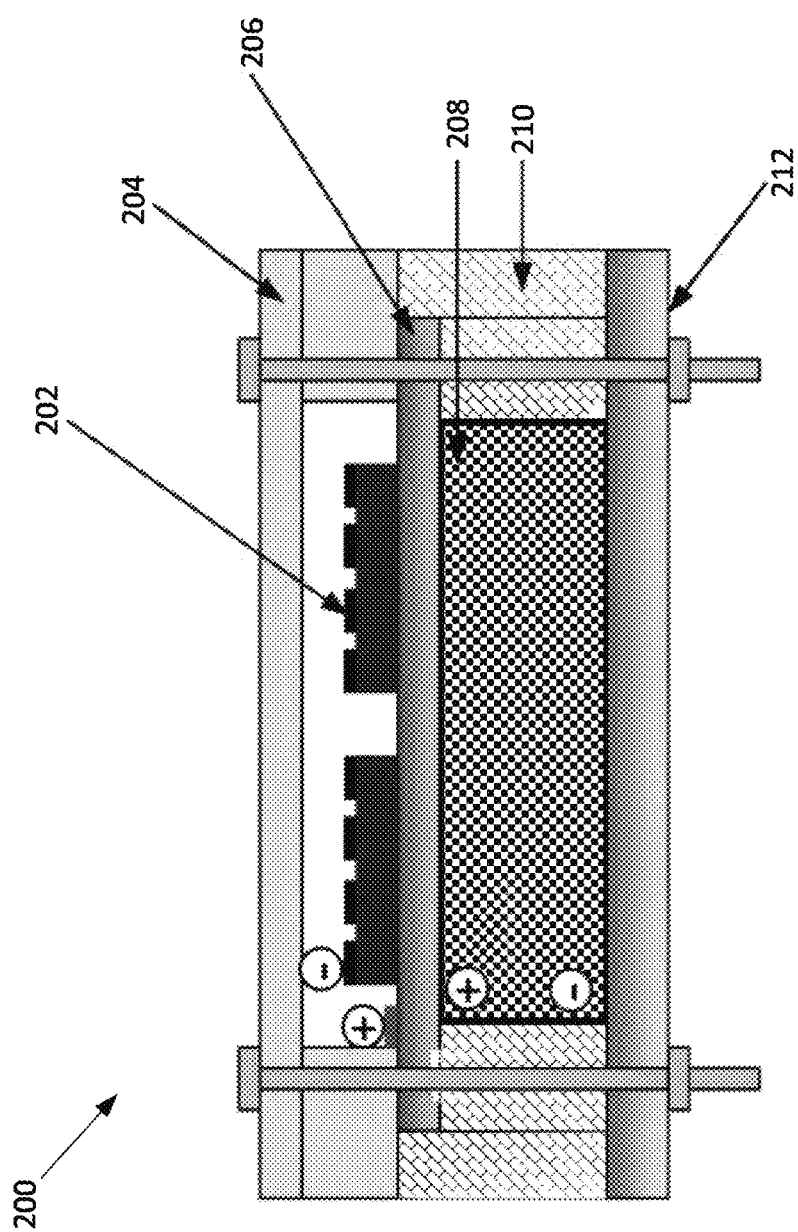
FIG. 2A illustrates an exemplary embodiment of a self-cooled photovoltaic solar panel assembly formed by integrating a generalized heat pump with the solar panel assembly.

FIG. 2A illustrates an exemplary embodiment 200 of a self-cooled photovoltaic solar panel assembly formed by integrating a generalized heat pump with the solar panel assembly. The self-cooled photovoltaic solar panel assembly may comprise PV solar cells 202, acrylic shield 204, heat spreader and upper assembly plate 206, heat pump 208, thermal insulation (Styrofoam) 210, and heat sink and lower assembly plate 212 (passive or active (e.g. liquid-cooled)). Heat Pump 208 may comprise a layer of heat pump cooling material. The "+" and "−" symbols indicate a positive terminal and negative terminal, respectively.

By way of example, and without limitations, some novel features that differentiate this construction from prior designs include: (a) the use of thermally conductive heat spreader material between the PV solar cells 202 and the heat pump 208 which allows efficient lateral heat flow, i.e., maximizing heat flow, (b) the use of thermal insulation (Styrofoam) 210 the sides to prevent or minimize lateral heat leakage, and (c) use of a passive or active heat sink 212 as the last bottom layer for efficient heat transfer, i.e., maximizing heat transfer, out of panel assembly.

Figure 2B:
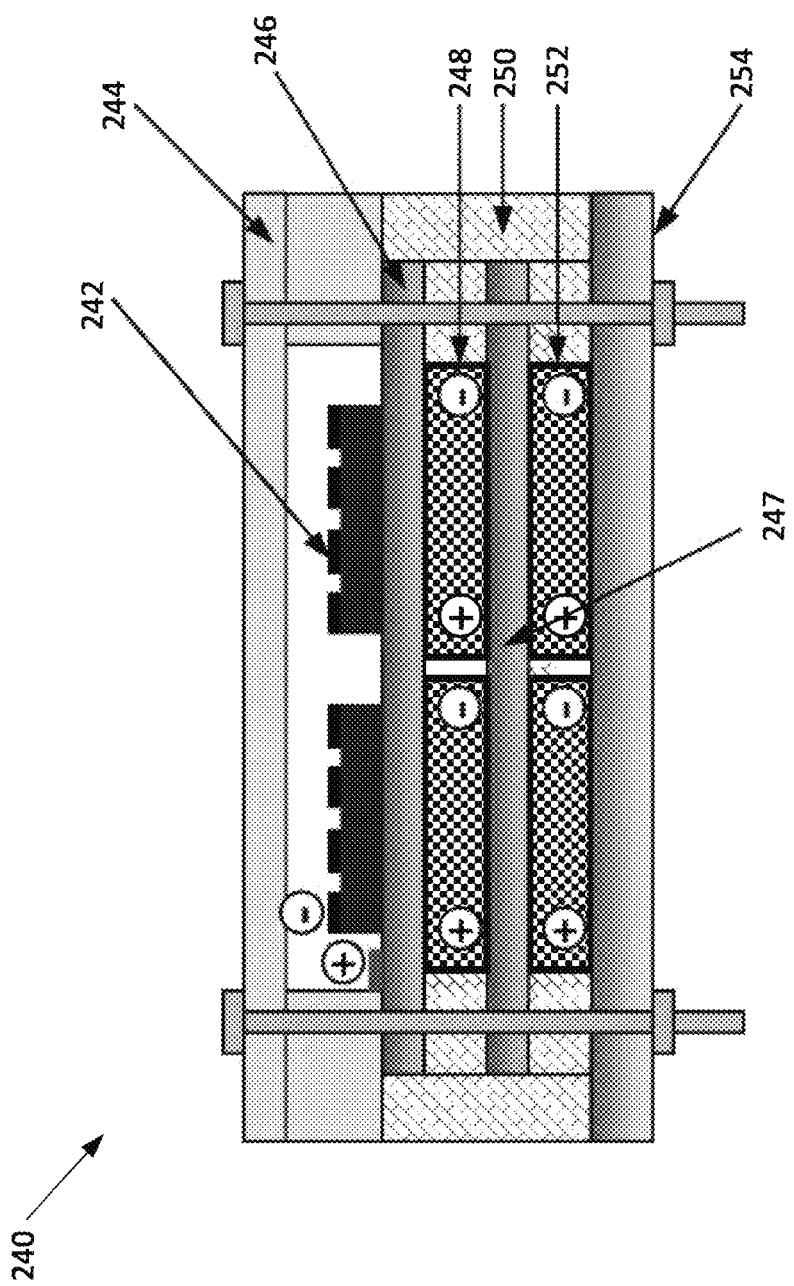
FIG. 2B illustrates an exemplary embodiment of a self-cooled photovoltaic solar panel assembly formed by integrating a thermoelectric heat pump with the solar panel assembly.

FIG. 2B illustrates an exemplary embodiment 240 of a self-cooled photovoltaic solar panel assembly formed by integrating a thermoelectric heat pump with the solar panel assembly. The self-cooled photovoltaic solar panel assembly may comprise PV solar cells 242, acrylic shield 244, heat spreader and upper assembly plate (copper) 246, TEC layer #1 248, thermal insulation 250 (Styrofoam), TEC layer #2 252, and heat sink and lower assembly plate 254 (passive or active (e.g. liquid-cooled)), and heat spreader 247. Thermoelectric cells (TE Cells) may be formed by components TEC layer #1 248, thermal insulation 250, TEC layer #2 252. TEC means thermoelectric cooling modules. The "+" and "−" symbols indicate a positive terminal and negative terminal, respectively.

As illustrated, the mechanical construction of the self-cooled solar panel of FIG. 2B may include TE Cells as the heat pump element. Those skilled in the art, in light of the present teachings, will readily recognize that a self-cooled solar panel based on TE Cells may provide preferred results as compared to the self-cooled solar panel with the generalized heat pump of FIG. 2A. A factor in the mechanical design may be the thermal coupling between the TE Cells and the PV solar cell 242 to insure that the best possible thermal contact between TE Cells and the PV solar cell 242 may be achieved. A difficulty obtaining the best possible contact may be that the surface of TE Cells may be composed of ceramic material to which a Si PV Cell cannot be thermally bonded. Additionally, the bottom surface of the PV solar cell 242 is its positive terminal and good electrical contact to the bottom surface may be essential. To work around these difficulties, the arrangement shown in FIG. 2B may be employed. The PV solar cell 242 may be soldered to a thin electrically and thermally conductive heat spreader and upper assembly plate (copper) 246. This heat spreader plate and a second thermally conductive plate which acts as a heat sink may be then clamped using high tension spring clamps with the TE Cells sandwiched between them. Multiple layers on TE Cells may be employed. FIG. 2B depicts two layers of TE Cells in use, although other exemplary embodiments may comprise more than two layers. Silver paste may be applied to both surfaces of the TE Cells to improve thermal coupling with the heat spreader and heat sink plates. Foam insulation may be placed between the TECs to ensure no heat entry from the edges. Good electrical contact may be made to the PV Cells. One method to accomplish this aspect of at least some embodiments of the present invention may be to bolt a thick gauge wire to the heat spreader plate on bottom side and by soldering a thick gauge wire to the metal grid on the top side of the PV solar cell 242.

FIG. 2A and FIG. 2B illustrate two embodiments of mechanical integration of a heat pump and a solar panel. The concept may be extended to a mechanical integration of a heat pump with another functional element that requires a transfer of heat energy from a source of heat to a destination called a "heat sink". This may include, but not limited to: space heating and cooling needs (HVAC), water heating, and district heating (extracts heat from a body of water).

Figure 3:
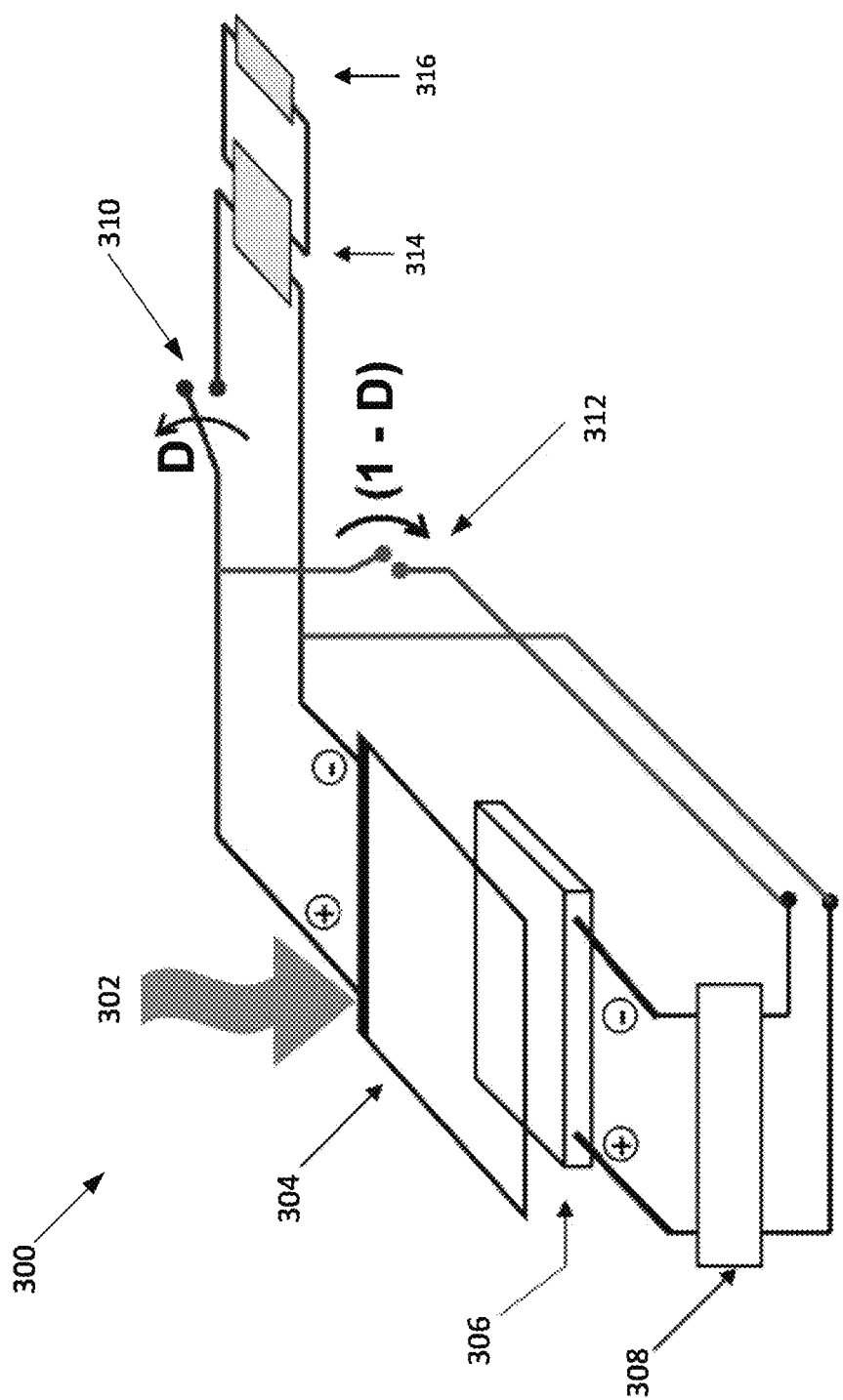
FIG. 3 illustrates an exemplary embodiment of an electrical implementation of a self-cooled solar cell.

FIG. 3 illustrates an exemplary embodiment 300 of an electrical implementation of self-cooling mechanism as employed in the present embodiment. As illustrated, sunlight 302 illuminates solar panel 304. The positive and negative terminals of solar panel 304 may be coupled to one pair of ports of a power conditioner 314, with the positive terminal being coupled via switch S1 310. Another pair of ports of power conditioner 314 may be coupled to load 316. Heat pump 306 may be located proximate to solar panel 304. The positive and negative terminals of heat pump 306 may be coupled to one pair of ports of impedance matching circuitry 308. Each of the other pair of ports of impedance matching circuitry 308 may be coupled to either the positive terminal of solar panel 304 via switch S2 312, or coupled to the negative terminal. The "+" and "−" symbols indicate a positive terminal and negative terminal, respectively.

Those skilled in the art, in light of the present teachings, will readily recognize that self-cooling may be conceptually implemented by diverting a small portion of the solar panel 304's own power to heat pump 306 that may be integrated mechanically with solar panel 304. For purposes of this discussion it may be assumed that heat pump 306 may be realized using TE Cells. In practice, other types of heat pumps may be employed. In many practical applications, power diversion may be realized, by way of example, and without limitations, and according to the teachings of the present embodiment, by employing a time-division technique with a switching circuit, as illustrated by way of example, and without limitations, in FIG. 3. An element of this implementation may be the pair of switches, switch S1 310 and switch S2 312. As discussed herein, switch S1 310 may be referred to as "S1" and switch S2 312 may be referred to as "S2".

The switches may oscillate between two states. In State #1, S1 may be closed, S2 may be open. In State #2, S1 may be open, S2 may be closed. In State #1 solar panel 304 powers the real load. In State #2, solar panel 304 powers the heat pump 306. In actual usage, the system may remain in State #1 for the majority of the time, flipping to State #2 momentarily during which time the solar panel 304 may be cooled by heat pump 306. In this manner, the power from solar panel 304 may be time-shared between the electrical load and the cooling unit. Flipping from State #1 to State #2 may happen at a fixed frequency. During each switching cycle, the fraction of time period in State #1 relative to the fraction of time period in State #2 may be called the "duty cycle" (D). 100% duty cycle may imply that the solar panel 304 may be constantly supplying the true load and no power may be being diverted to the cooling unit. Likewise, 50% duty cycle implies S1 may be closed and the true load may be powered for half the switching time period while S2 may be closed and the cooling unit may be powered for the other half of the switching period. The further the duty cycle may fall from 100%, when more power is diverted away from the load 316 to the heat pump 306. While diverting more power to the heat pump 306 reduces the power available for the true load, it may also increase the total power delivered by solar panel 304 by lowering the internal panel temperature. There may be two opposing factors at play and there may be an optimal value of the duty-cycle at which the net power output of solar panel 304 may be maximized. This optimal value of the duty cycle may be determined by the decision module 112 shown in FIG. 1. Decision module 112 may utilize sensors inputs 114, such as, and without limitations, the internal panel temperature, ambient air temperature, panel output voltage and current, humidity, etc. and may use a built-in algorithm to determine the optimal duty-cycle value. This optimal duty-cycle value may be then converted to an electrical signal by the power controller 110 shown in FIG. 1. The decision module 112 may also connected to the worldwide web which may allow it to access weather forecast information and use this information in determining the optimal duty-cycle. The switching system may be a synchronous switching system or an asynchronous switching.

In summary, by way of an example, and without limitations, FIGS. 1, 2, 3 describe a method and apparatus for increasing power output of solar panel 102 using adaptive self-cooling. For any net power gain, the operation of the described structural unit may be controlled optimally. Heat pump 106 may be powered using a tightly controlled fraction of the PV Cell's power. This control mechanism may be embodied in power controller 110 and decision module 112 shown in FIG. 1. A novel programmable electronic switching circuitry may be employed in power controller 110 that (a) allows for instantaneously changing the amount of electrical power diverted from the PV Cells to the heat pump 106, and (b) impedance matches the PV solar cell 104 and heat pump 106 electrically so that maximum power may be delivered from the PV solar cell 104 to the heat pump 106. Decision module 112 drives the power controller 110 may use a uniquely designed smart microcontroller that takes as inputs various items such as, and without limitation, PV cell temperature, outside air temperature, wind speed, weather forecast, etc. Decision module 112 may then use these inputs in conjunction with information about the electrical and thermal models of the PV solar cell 104 and heat pump 106 that may be pre-programmed into it, to determine the most optimum amount of power to divert from the PV solar cell 104 to the heat pump 106 so that the net power gain may be maximized.

Some unique aspects of the present embodiment may be derived from the following point: From fundamental thermodynamics, the efficiency of heat pumps may increase rapidly as the temperature difference between the hot and cold sides may be reduced. Therefore, the control mechanism aims to keep the a PV Cell's temperature at or around ambient air temperature, i.e., there may be no attempt to chill the PV cell below ambient or to maintain it at some fixed temperature. Programmable electronic circuitry may be employed to match the PV solar cell 104 and heat pump 106 electrically so that a maximum power may be delivered from the PV solar cell 104 and heat pump 106.

The extension to networked and IoT applications, especially in remote and standalone environments, may be further elaborated in the following manner. In these applications, the energy required to operate the devices may often be harvested from the environment using elements such as, and without limitations, solar cells, piezo or thermoelectric generators, RF transducers etc. Certain embodiments of the present embodiment may be employed to improve power management features of such systems where, for, and without limitations, example, supply voltage and not CPW may be of prime concern. In such circumstances the decision module 112 may be programmed to improve output voltage by lowering the temperature of the power generator by adjusting duty cycle, at the cost of efficiency.

As previously noted, embodiments of the present invention may include the features of 1) a time-division based switching system with an adjustable duty cycle to manage an output, 2) a smart software defined control mechanism, capable of determining an optimal duty cycle based on sensory inputs and 3) a network controlled electronics that may allow predictive control. A combination of these features may be incorporated in other embodiments to determine and/or optimize outputs based on a variety of inputs. These other embodiments may operate in a network environment. Examples may include, and without limitations, applications for the internet of things (IoT), such as, and without limitations, smart home, smart city, smart grids, industrial internet, connected car, connected health, smart retail, smart supply chain, smart farming and wearables. Other embodiments may include applications where a reasonable precise feedback system requiring rapid changes or responses (e.g. milliseconds) based on various inputs. Some applications may include, and without limitations, adaptive voice and video streaming, adaptive battery charging, and adaptive lighting systems.

Figure 4:
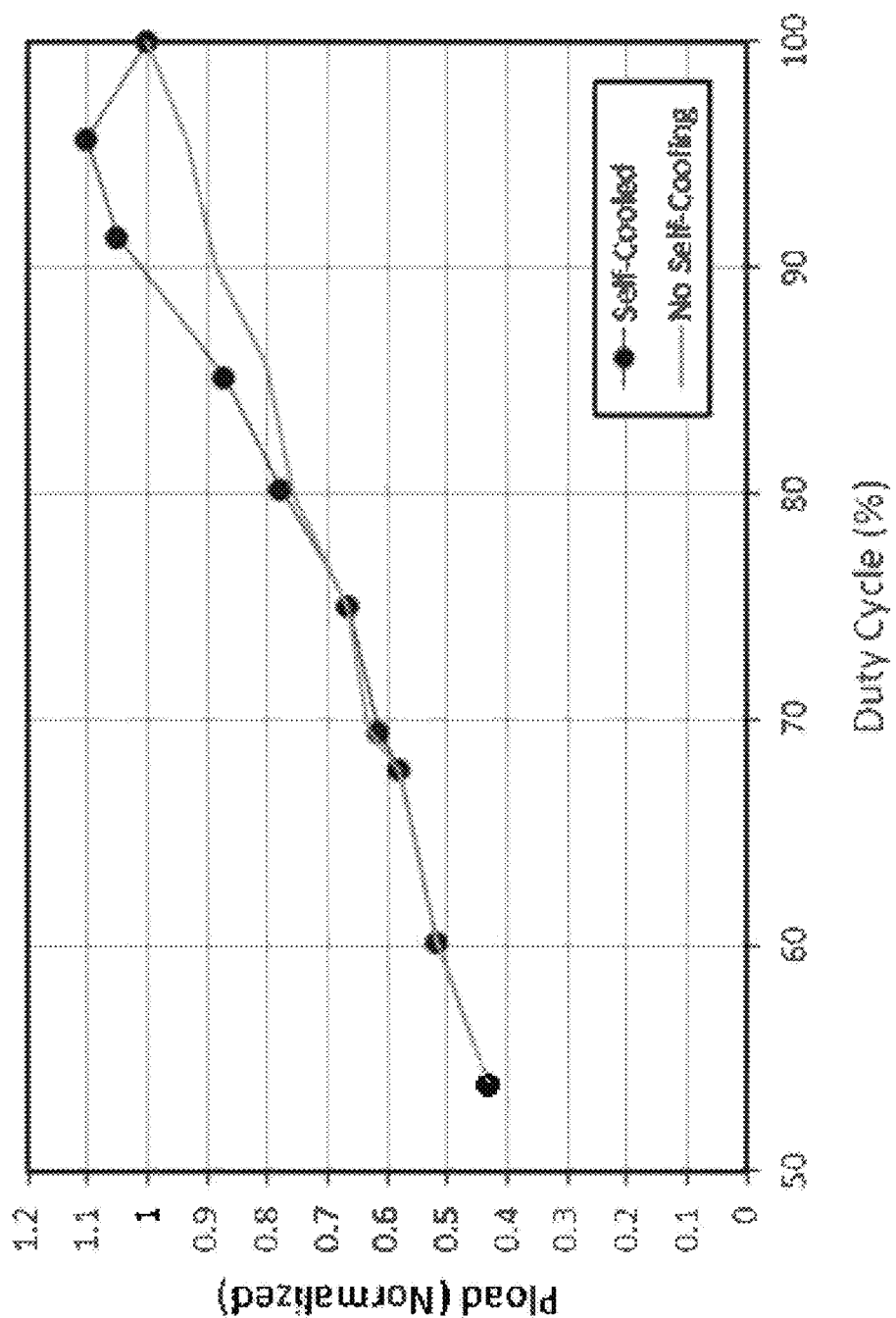
FIG. 4 illustrates a representative power output versus duty cycle for a thermoelectric self-cooling solar cell for an embodiment of the present invention.

Experiments have been conducted to examine the power output versus duty cycle for solar cells with and without self-cooling. FIG. 4 graphically illustrates the results of the experiment. Power delivered to the load is shown on a normalized basis. As observed, there may be a general linear relation between power and duty cycle. As the duty cycle is lowered slightly from 100%, the power output of the cell may increase. With further decreases in duty cycle, the power output may begin to drop. At around 90% duty cycle the advantage from self-cooling may drop to zero. At the peak output, which occurs at about 96% duty cycle, the solar cell output with self-cooling may be about 10.25% higher than without self-cooling.

Figure 5:
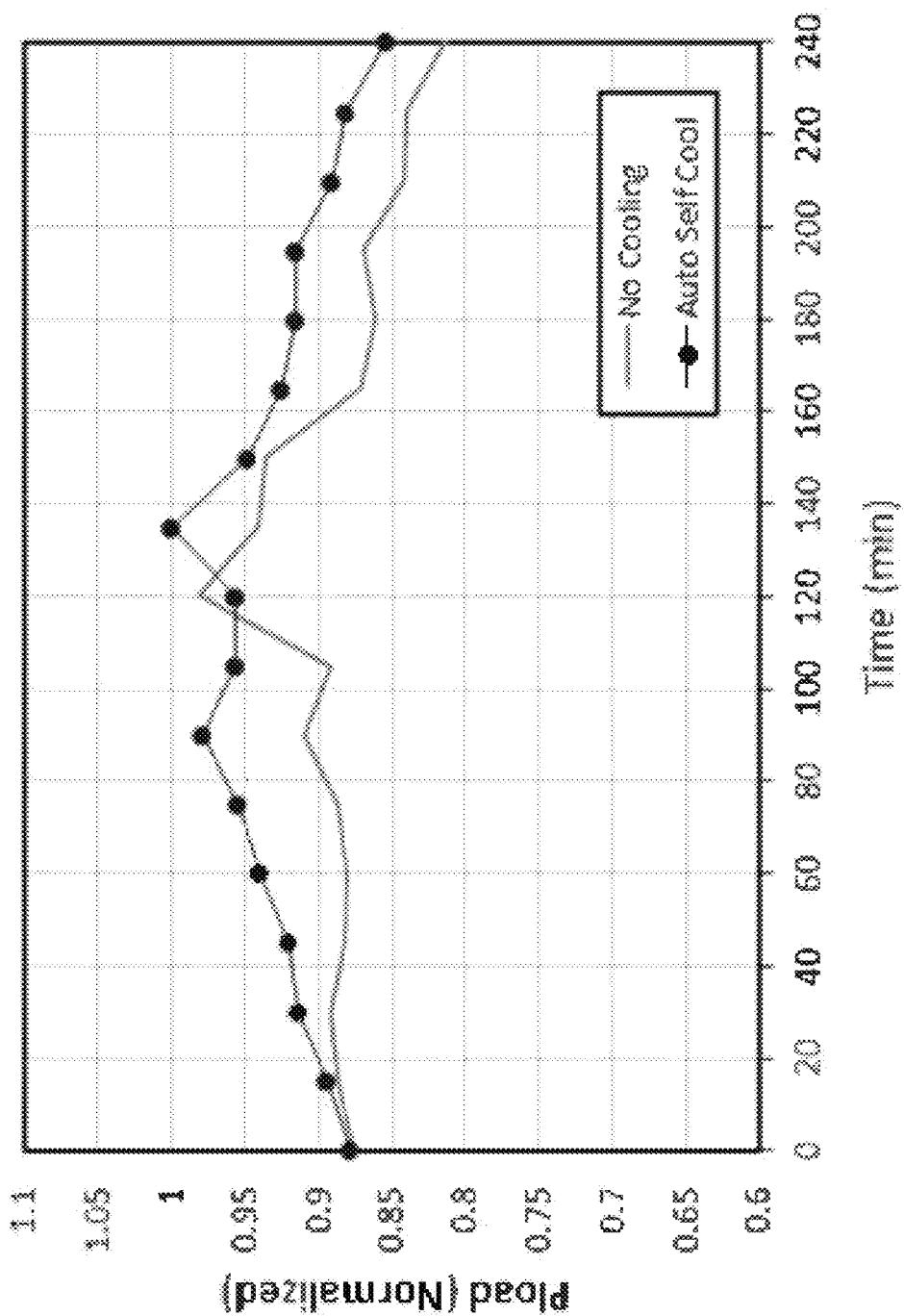
FIG. 5 illustrates a representative power output of a thermoelectric self-cooling solar cell with auto adjusted duty cycle for an embodiment of the present invention.

Experiments have been conducted to examine impact of an auto adjusted duty cycle. FIG. 5 illustrates the experimental results for the power output of a thermoelectric self-cooling solar cell with auto adjusted duty cycle. Power to the load are shown on a normalized basis. The results presented are for the case where the solar cell operates autonomously, i.e., the solar cell may adjust the switching duty cycle automatically depending on the difference between the temperatures sensed at the cell itself and the ambient air. The experiment was conducted under natural sunlight with the cell in auto adjusting self-cooling mode. Measurements were recorded every 15 minutes from 11:00 am to 3:00 pm. For comparison, the same measurements were repeated without self-cooling. FIG. 5 shows the results. It may be observed from the results that the self-cooled cell may produce more power at almost all time points compared to the cell with no cooling. As the air temperature increased, there was a drop in the open circuit voltage; but because of the simultaneous increase in sun angle, the short circuit current also increased. Because of these two opposite effects, the overall variation in power output over the four hour measurement period was quite uniform. The self-cooled cell produced more power consistently as compared with the cell without cooling.

An embodiment(s) of the present invention will now be described with reference to technologies and features incorporated in the exemplary embodiments of a software defined controller unit for adaptively self-cooled photovoltaic solar panels, as illustrated in FIGS. 6-9.

The software defined controller unit may be a novel "smart" device, essentially implemented in software that controls the operation of a self-cooled solar panel with an integrated heat pump in a manner that may maximize the net power output of the panel. Some of the considerations include: (1) Utilizing power from the PV Cells to drive the TE Cells in an optimal manner may require special interface electronics that may "match" the two types of cells electrically. The requirements for such electrical matching between the PV Cells and the TE Cells may not be static. The requirements may change significantly with external conditions such as, and without limitations, shadowing of the PV Cells, changes in atmospheric conditions, etc. and the ability of interface electronics to be able to react to such changes; (2) Since thermal systems may react quite slowly, any sensor based control of such systems may ideally be predictive. Otherwise the reaction may significantly lag what may be desired under the presently existing sensed conditions. To produce an accurate response, the control system may also need to be aware of the characteristics of its component elements, by way of example, but not limited to, the electrical behavior of the PV Cells and TE Cells. The sensor based control system may have these forward looking or "smart" features, which may ultimately result gains in power output or efficiency.

The power generated by a solar panel may be increased by cooling the solar panel. An aspect of at least some embodiments of the present invention may be to provide an effective method to control the energy used by any cooling unit attached to a panel in manner that increases the net power output of the system (net power output=raw power generated by solar panel minus power consumed by cooling unit). In other words, the power needed to cool the panel may typically be more than the increase in power output of the cooled panel, which may make existing cooling techniques counterproductive. Embodiments to address these issues, with software based methods, are described herein.

As previously described relative to FIGS. 1-3, solutions to the aforementioned issues may be based on the idea of periodically diverting a fraction of the solar panel's own power to the cooling unit. This idea may need accurate control of the fraction of the panel's output power that may be diverted to the cooling unit. A possible solution may employ a time-division approach to achieve the required degree of control. The ratio of the time duration for which the panel may power its actual load to the time it may power its cooling unit is the duty-cycle. A 100% duty cycle may imply the solar panel is constantly supplying its actual load and no power is being diverted to its cooling unit. Likewise, a 50% duty cycle may imply the panel is supplying its actual load for half of a period and diverting its power to its cooling unit for the other half of the period. By optimally adjusting this switching duty cycle it may be possible to maximize the net power output of the panel.

A "steepest descent" optimization approach may be employed to adaptively tune the duty-cycle for maximum net power output from the panel under varying atmospheric conditions. The technique may work by iteratively updating an independent variable, by way of example, but not limited to, the duty-cycle, such that a pre-defined objective function may either maximized or minimized. Any suitable objective function may be employed, by way of example, but not limited to, the power delivered by the panel to its load. The scheme may be implemented using sensors, samplers, and a miniature on-board signal processing computer that continually updates the duty-cycle by estimating the gradient (i.e. derivative) of the objective function with respect to the duty-cycle.

The objective function may be a target expressed as a function of a set of variables that may be tuned. In many embodiments of the present invention, several different objective functions may be possible. As noted, one example, without limitation, may be the power output of the solar panel whose internal temperature may be controlled. For one possible objective functions, one independent variable that may be optimized is the switching duty-cycle. Therefore, the objective functions may be expressed in terms of the switching duty-cycle. Details of possible objective functions and switching duty-cycle pertinent to embodiments of the present invention are provided herein.

Figure 6A:
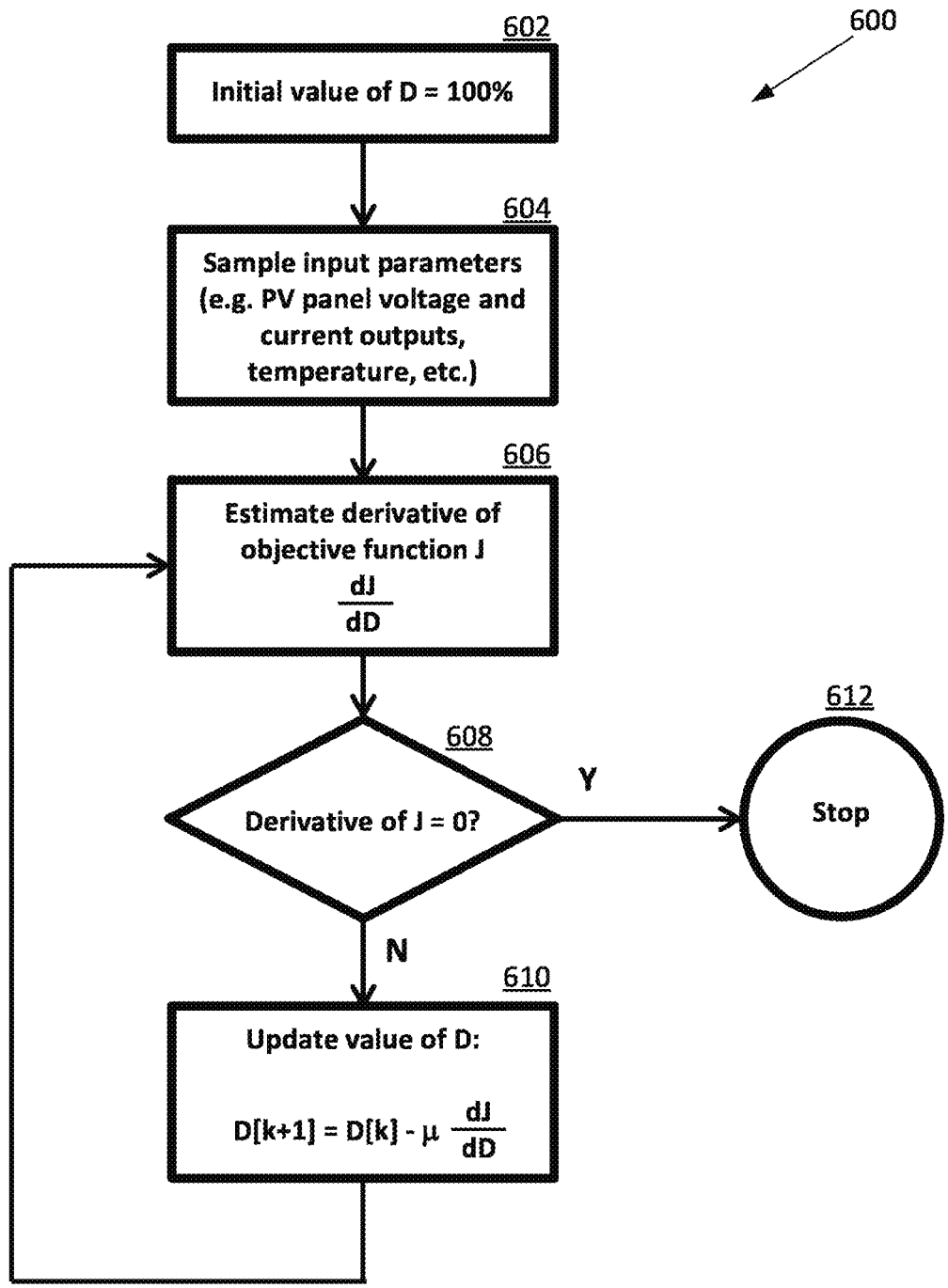
FIG. 6A illustrates an exemplary flowchart 600 of the steps employed by a controller for adaptively updating the switching duty-cycle D of a self-cooler solar panel, in accordance with an embodiment of the present invention.

FIG. 6A illustrates an exemplary flowchart 600 of the steps employed by a controller for adaptively updating the switching duty-cycle D of a self-cooler solar panel, in accordance with an embodiment of the present invention. The process of the present method embodiment depicted in Flowchart 600 may employ a steepest descent algorithm. The present method exemplified in flowchart 600 may begin with an initial estimate of the location of the minimum (or maximum), at step 602. The method proceeds to sample input parameters in order to improve the accuracy of the estimate, at step 604. The sample parameter may include, and without limitations, PV panel voltage, current outputs, temperature. The present method may evaluate which direction from this estimate is most steeply "downhill," and then may make a new estimate along the downhill direction at steps 606, 608 and 610. Conversely, optimizing for a maximum may begin with sampling of input parameters at step 604, and with an initial estimate of the location of the maximum, at step 602. The present method may proceed to evaluate which direction climbs the most rapidly at step 606, and then may make a new estimate along the "uphill" direction, at steps 608 and 610. Executed correctly, the new estimates may be more accurate than the prior estimates. The process may be repeated at steps 610 and 606, resulting in an estimate closer to an optimal location after every iteration.

The following is a detailed description of the steps for the method of flowchart 600:

Initial value of switching duty-cycle D is equal to 100% (step 602)

Sample input parameters (e.g. PV panel voltages and current outputs, temperature, etc. (step 604)

Estimate derivation of objective function J equals dJ/dD (step 606)

Determine derivative of J=0. (step 608)

If derivative of J is not equal to zero, update the value of D as follows: D[k+1]=D[k]−μ, where k=is a point in time, and μ is a small positive number called the step size. (step 610)

Return to step 606 and re-estimate the derivative of objective function J based on the updated value of D. (step 610 and step 606).

If the derivative of J is equal to zero, the present method stops. (step 612)

An aspect in this procedure may be to recognize that the uphill direction is defined by the gradient evaluated at the current location, while the downhill direction may be the negative of this gradient. To apply steepest descent to the minimization of an objective function J(x), suppose that a current estimate of x is available at time k, which is denoted x[k]. A new estimate of x at time k+1 may be determined using:

$$x[k+1] = x[k] - \mu \frac{dJ}{dx}\bigg|_{x[k]}$$

where μ is a small positive number called the step size, and the gradient (derivative) of J(x) is evaluated at the current point x[k]. This calculation may then be repeated several times as k increments until the gradient becomes sufficiently small, as determined by one skilled in the art, in light of the present teaching. When the current estimate x[k] is a value greater than the minimum location, the negative of the gradient may point lower and may move the next estimate closer to the minimum. The opposite may be true when the current estimate is at a value of x that is smaller than the minimum location. In either case, as long as the step size is suitably small, the new estimate x[k+1] may be closer to the minimum than the old estimate x[k]; that is, J(x[k+1]) is less than J(x[k]). In fact, the system described by the above equation may be viewed as a discrete time linear system whose stability may be fully determined.

The application of the above algorithm in embodiments of the present invention will now be discussed. For purposes of optimally controlling the net power output of an actively cooled solar panel, a choice for the objective function J(x) may be the panel power output and the variable to be optimized may be the switching duty-cycle. The details of the physical manner in which the duty-cycle affects the cooling power of the heat pump and thereby the power output of the panel were previously described relative to FIGS. 1-5. The implementation of the steepest descent technique may require an estimation of the derivative of the objective function with respect to the variable being optimized, as mentioned earlier. In this case, this may be the derivative of the power output of the panel with respect to the duty-cycle. The relation between these two quantities may be too complex for the derivative to be computed analytically. Rather, the relation between these two quantities may be estimated by re-sampling the panel voltage and output current at various increments of duty-cycle and numerically estimating the derivative. Mathematically, the instantaneous panel output power P may be the product of its output voltage and current. As a result, the derivative may be expressed as $$\frac{dP}{dx} = \frac{d}{dx}(IV) = V\frac{dI}{dx} + I\frac{dV}{dx}$$

where x is the duty-cycle, V is the panel voltage and I is the panel output current. Since the panel current may be insensitive to the temperature and therefore practically independent of the duty-cycle, the first term on the right of the equation above may be ignored. Additionally, the derivative dV/dx may be estimated by re-sampling the panel voltage for two slightly different values of duty-cycle, i.e.

$$\frac{dV}{dx} \approx \frac{\Delta V}{\Delta x} = \frac{V(x+\delta) - V(x-\delta)}{2\delta}$$

and multiplying the result with the panel current. The denominator 2δ may be absorbed in the step-size parameter μ. This procedure is illustrated in the schematic representation 700 shown in FIG. 7A. Those skilled in the art, in light of the present teaching, may readily recognize that other objective functions may also be feasible and may be treated in a manner similar to the above. Two additional objective functions and their respective implementation details are shown in FIG. 7B and FIG. 7C.

Figure 6B:
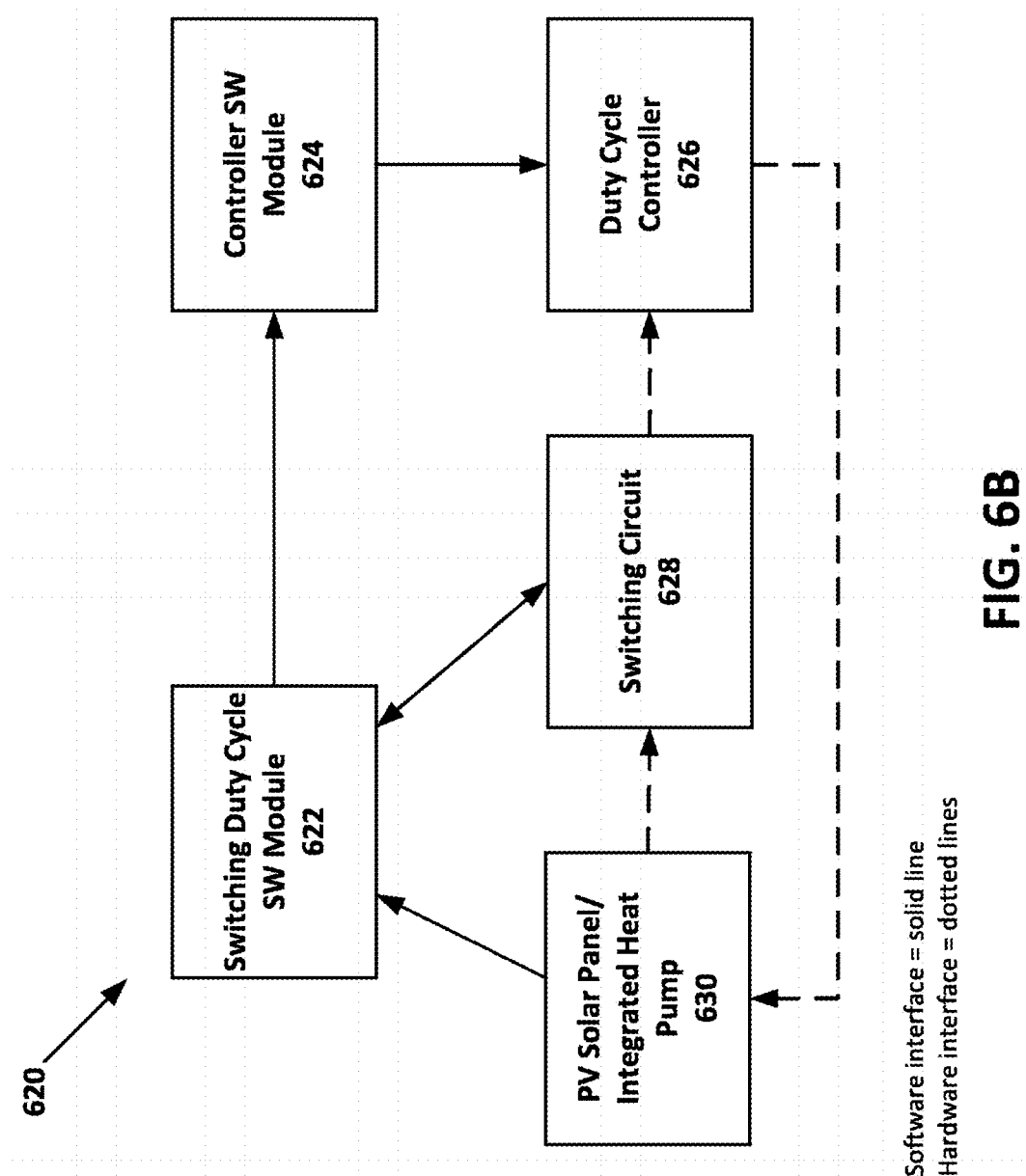
FIG. 6B illustrates a software architecture of an exemplary system for providing adaptively updating the switching duty-cycle D of a self-cooler solar panel, in accordance with an embodiment of the present invention.

As previously noted, FIG. 6A illustrates an exemplary embodiment for a flowchart 600 depicting the steps employed by a controller for adaptively updating the switching duty-cycle D, of a self-cooler solar panel, in accordance with an embodiment of the present invention. The value of the switching duty-cycle may be a measure of the energy consumed by the heat pump, which in turn may determine the amount of heat energy removed from the panel and ultimately the panel temperature. An aspect of at least some embodiments of the present invention may be to maintain the panel's internal temperature at or near the external ambient air temperature. FIG. 6B illustrates a software (SW) architecture 620 of an exemplary system for providing adaptively updating the switching duty-cycle D of a self-cooler solar panel, in accordance with an embodiment of the present invention. A switching duty cycle SW module 622 may provide adaptive updating based on the method provided in flowchart 600. Switching duty cycle SW module 622 may include support for three embodiments utilizing this method as described in embodiments of the present invention, FIGS. 7A, 7B and 7C. For FIG. 7A, the associated elements related to switching duty cycle SW module 622 are sampler 706, resampler 708, resampler 710 and function μΣ 712. FIGS. 7B and 7C include similar elements. As illustrated, the switching duty cycle SW module 622 may interface with a PV Solar Panel/Integrated Heat Pump 630 and switching circuit 628. The switching duty cycle SW module 622 may be coupled to a controller SW module 624. The controller SW module 624 may process a new duty-cycle estimate that is received from the switching duty cycle SW Module 622. The duty cycle controller 626 may provide a control signal to the PV solar panel/integrated heat pump 630. For FIG. 6B, the solid line indicates a software interface and a dotted line indicates a hardware interface.

Figure 6C:
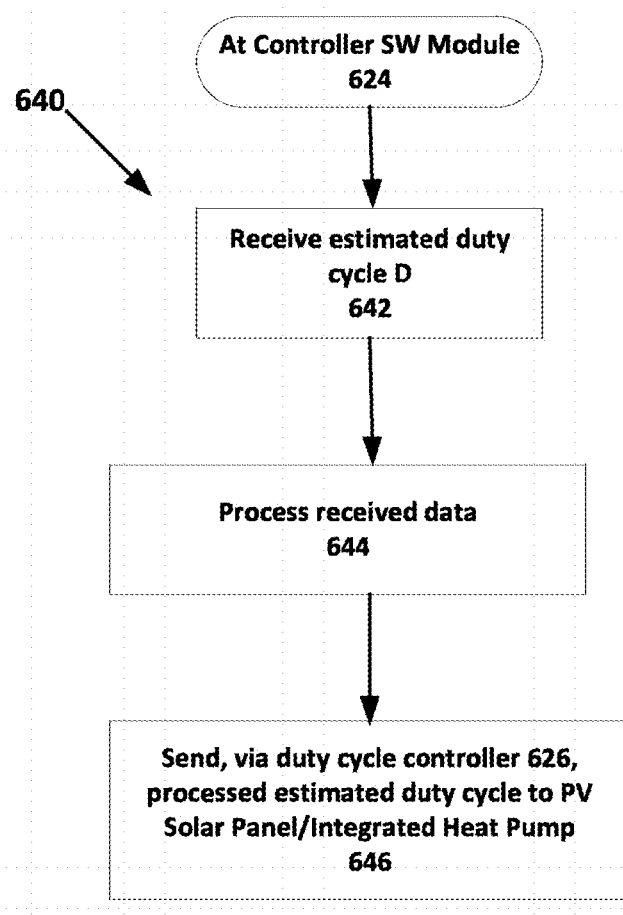
FIG. 6C illustrates a flowchart 640 of the operation for controller SW module 624, in accordance with an embodiment of the present invention.

FIG. 6C illustrates a flowchart 640 of an exemplary method for the process carried out by controller SW module 624, in accordance with an embodiment of the present invention. Controller SW module 624 may receive an estimated duty cycle in step 642 from the switching duty cycle SW module 622, via switching circuit 628. Controller SW module 624 may process the received data in step 644. Controller SW module 624 may proceed to send the processed estimated duty cycle via duty cycle controller 626 to PV solar panel/integrated heat pump 630 in step 646.

As a summary, by way of example, and without limitations, embodiments of the present invention may provide solutions to control the amount of power provided to a cooling module attached to a solar panel such that the internal temperature of the panel may be maintained at a value that maximizes its net power output for periods of time. In the case of embodiments of the present invention, described herein, may allow a high degree of control to be exerted by implementing an adaptive duty-cycle adjustment scheme. FIG. 3 illustrates an exemplary embodiment of a conceptual electrical implementation of such as, and without limitations, a self-cooled solar cell.

Some embodiments of the present invention disclose a method for providing adaptive updating of the switching duty cycle of a self-cooler solar panel comprising the steps of initially setting a 100% switching duty cycle, in which said solar panel is constantly supplying power to a load, while no power is being diverted to said integrated heat pump; sampling one or more input parameters; estimating a gradient of a power output of a solar panel with an integrated heat pump relative to a current switching duty cycle of said solar panel, in which said estimation is based said sample input parameters; and generating an updated switching duty cycle by subtracting (i) said gradient of said power output relative to said current switching duty cycle times a step size from (ii) said current switching duty cycle. The method further comprises not updating said current switching duty cycle if said gradient of said power output relative to said current switching duty cycle of said solar panel is equal to zero, and after generating said updated switching duty cycle, repeating said estimation of said gradient of said power output relative to said current switching duty cycle of said solar panel based on said updated switching duty cycle. Continually updating said current switching duty cycle maximizes said power output delivered by said solar panel. One or more input parameters comprise a panel voltage, an output current, humidity and/or temperatures. Estimation of said gradient of said power output of said solar panel relative to said current switching duty cycle of said solar panel is determined by re-sampling a solar panel voltage and solar panel output current at various increments of said current switching duty cycle, and numerically estimating said gradient.

The following paragraphs describe the functionality of FIG. 3 with references to embodiments of FIGS. 7B, 8A-8C, and FIG. 9.

Figure 7B:
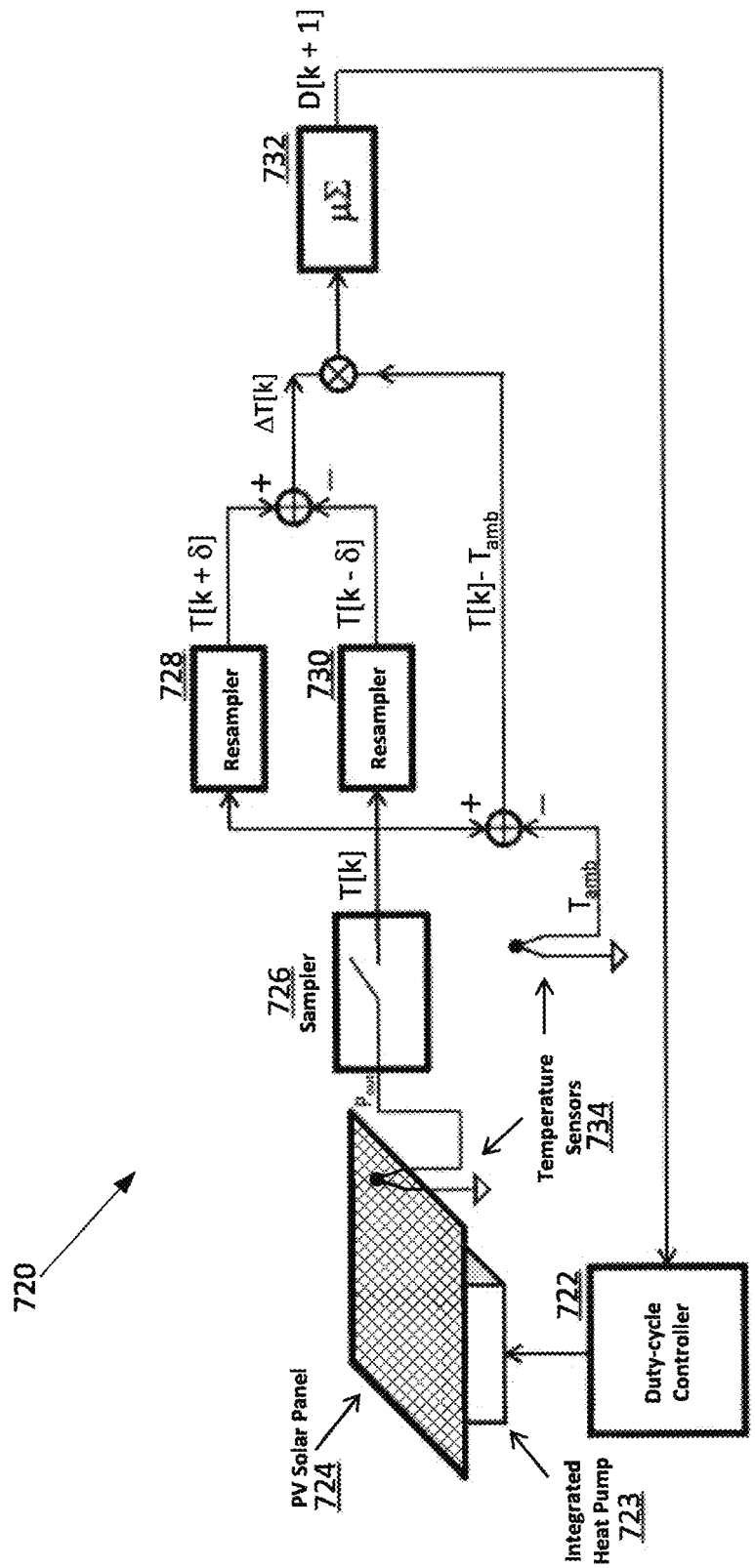
FIG. 7B illustrates an exemplary embodiment of another schematic representation of the adaptive, real-time, technique employed for updating the switching duty cycle of a self-cooled solar panel.
Figure 8A:
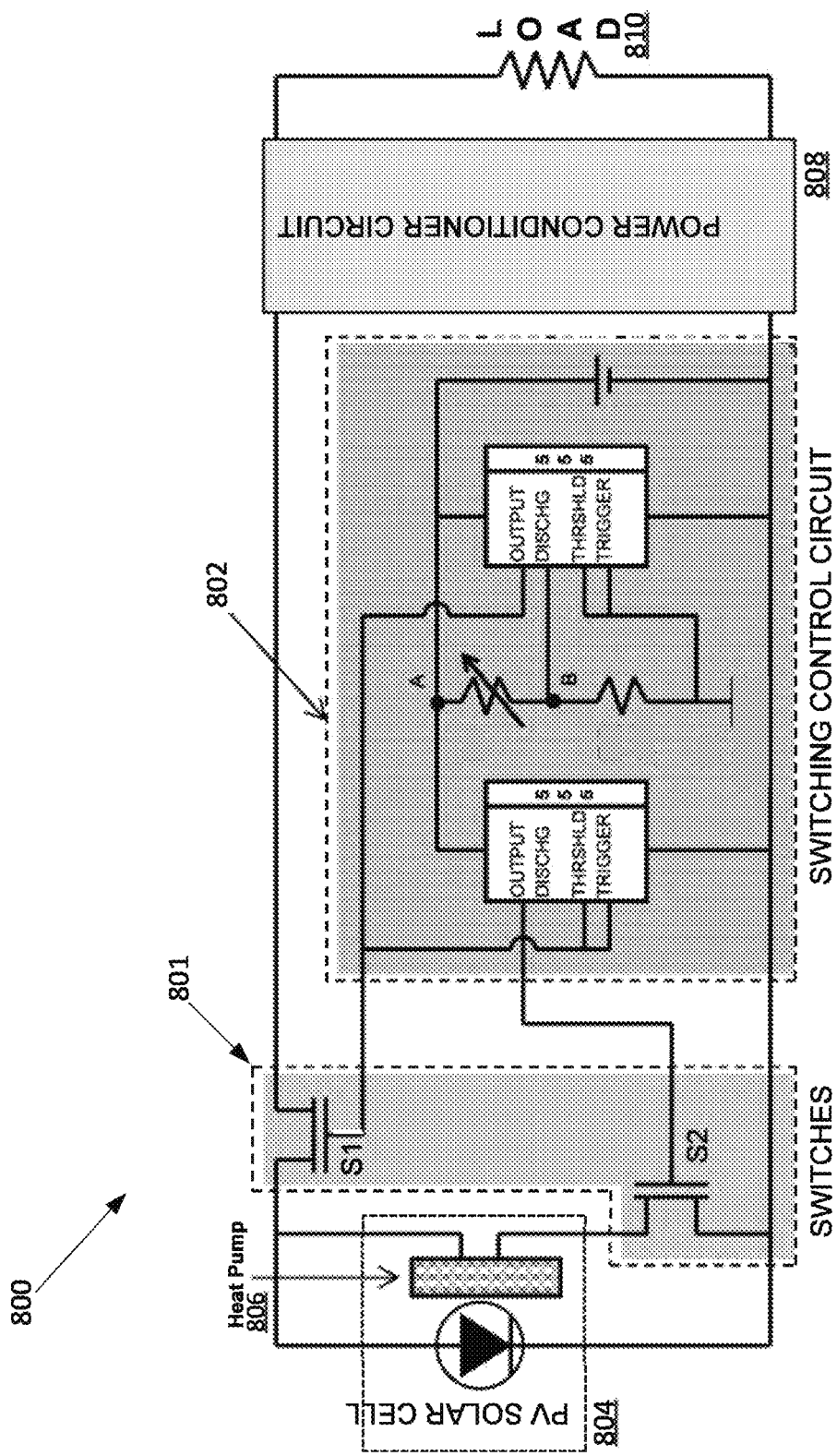
FIG. 8A illustrates an exemplary embodiment of a schematic showing details of electrical implementation of the switching mechanism shown in FIG. 3.

An embodiment of the electrical circuitry that may be employed to implement the functionality of FIG. 3 is shown in FIG. 8A. First, the switches S1 and S2 may be realized using power MOSFETs as shown in FIG. 8A. The switching frequency and duty cycle of the system may be controlled by the voltages applied to the gate terminals of these MOSFETs. The circuitry employed to generate the gate drive signals is shown in FIG. 8A by Switching Control Circuit 802. Two 555 timer ICs may be configured as a stable multi vibrators and may be employed as shown in Switching Control Circuit 802. The switching frequency may be determined by the values of resistor R2 and capacitor C1. Duty cycle may be controlled by the value of resistor R1. To realize the goals of the system, the value of resistor R1 may be made electronically variable. This adaptive control of R1 may be realized using the circuit shown in FIG. 8B. In this simplified implementation, two temperature sensor thermocouple modules 822 may be included in the system, one to sense air temperature in the vicinity of the solar panel, and another to measure the internal temperature of the solar panel. The voltage output of these thermocouple modules may provide a measure of the air and panel temperatures. These sensed voltages may be connected to the Analog-to-Digital (ADC) inputs of a microcontroller 828 which may sample the two signals periodically. The microcontroller 828 may be programmed to execute a series of actions. First, it may computes the optimal duty-cycle value using the two sampled input temperatures and employing the steepest decent algorithm shown in FIG. 6A. More specifically, for the example circuit shown in FIG. 8B, the appropriate objective function may be the square of the difference between the panel and air temperatures, and, therefore, the detailed algorithm based on the schematic of FIG. 7B may be applicable.

Figure 8B:
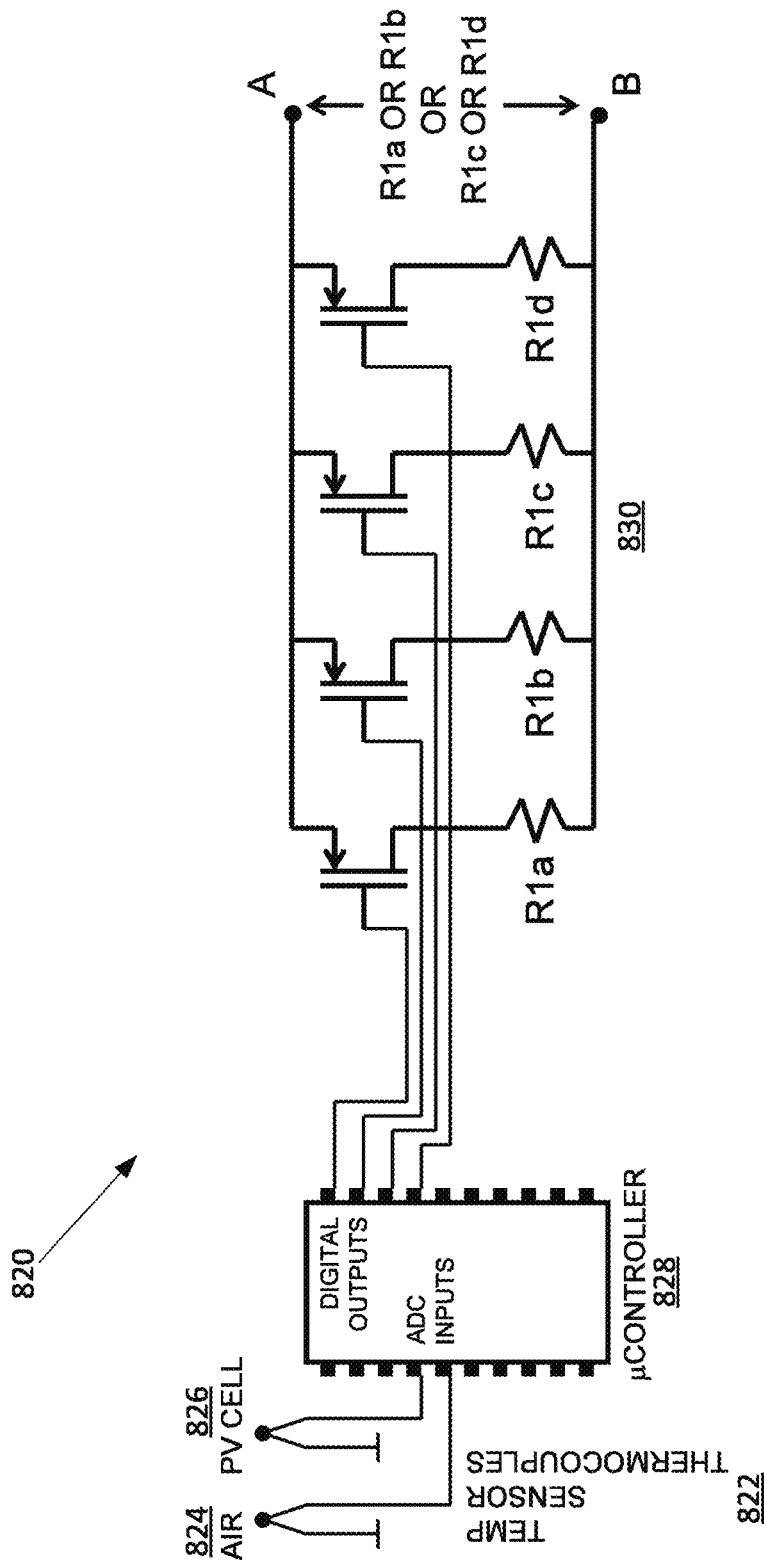
FIG. 8B illustrates an exemplary embodiment of a schematic showing details of electrical circuit employed to automatically vary the value of resistor R1 in the circuit of FIG. 8A.
Figure 8C:
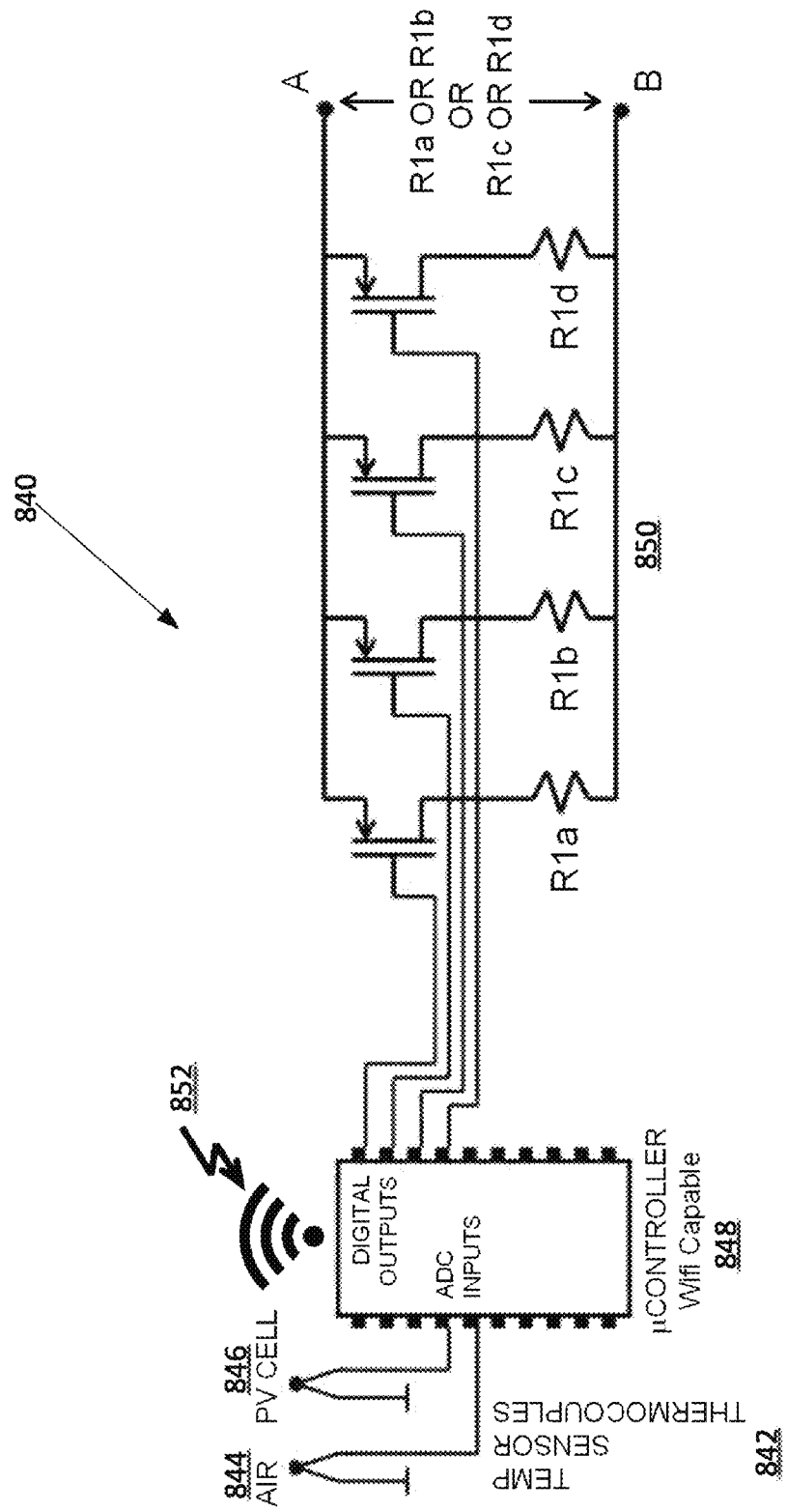
FIG. 8C illustrates an exemplary embodiment of another schematic showing details of electrical circuit that predictively and automatically varies the value of resistor R1 in the circuit of FIG. 8A.

It will be appreciated by one skilled in the art that the implementation of the gate drive circuit shown in embodiments FIGS. 8A, 8B and 8C are only example embodiments. There may be other embodiments. For example, but without limitation, if a sufficiently powerful microcontroller is used, the microcontroller itself could be programmed to generate the gate drive signals.

Next, after having determined the optimal duty-cycle, the microcontroller 828 of FIG. 8B may compute the value of R1 that achieve this duty-cycle. This value may then be rounded to the nearest of four available choices based on the difference between the sensed air temperature and PV Cell temperature. Depending on the chosen resistor value, the effective resistance between nodes A and B may be determined. Using this circuit in place of the variable resistor R1 shown in FIG. 8A may provide a mechanism to automatically control the switching duty cycle and thereby the temperature of the solar panel, and hence its power output capability. One skilled in the art will recognize that the use of four choices for the resistor R1 is only an example. Any number of choices may be implemented.

FIG. 8C may illustrate a more advanced exemplary embodiment of the adaptive duty cycle control circuit. This realization may utilize a Wi-Fi capable microcontroller 848, which may connect to the internet, acquire advance information about impending changes in atmospheric conditions, and may modify the value of R1 accordingly. Lastly, FIG. 9 may show a section of the computer code employed to control the effective value of resistor R1, and thereby the duty cycle and cooling power of the heat pump.

The following paragraphs provide a detailed discussion of schematics and computer code for FIGS. 7A-7C, 8A-8C, and FIG. 9.

Figure 7A:
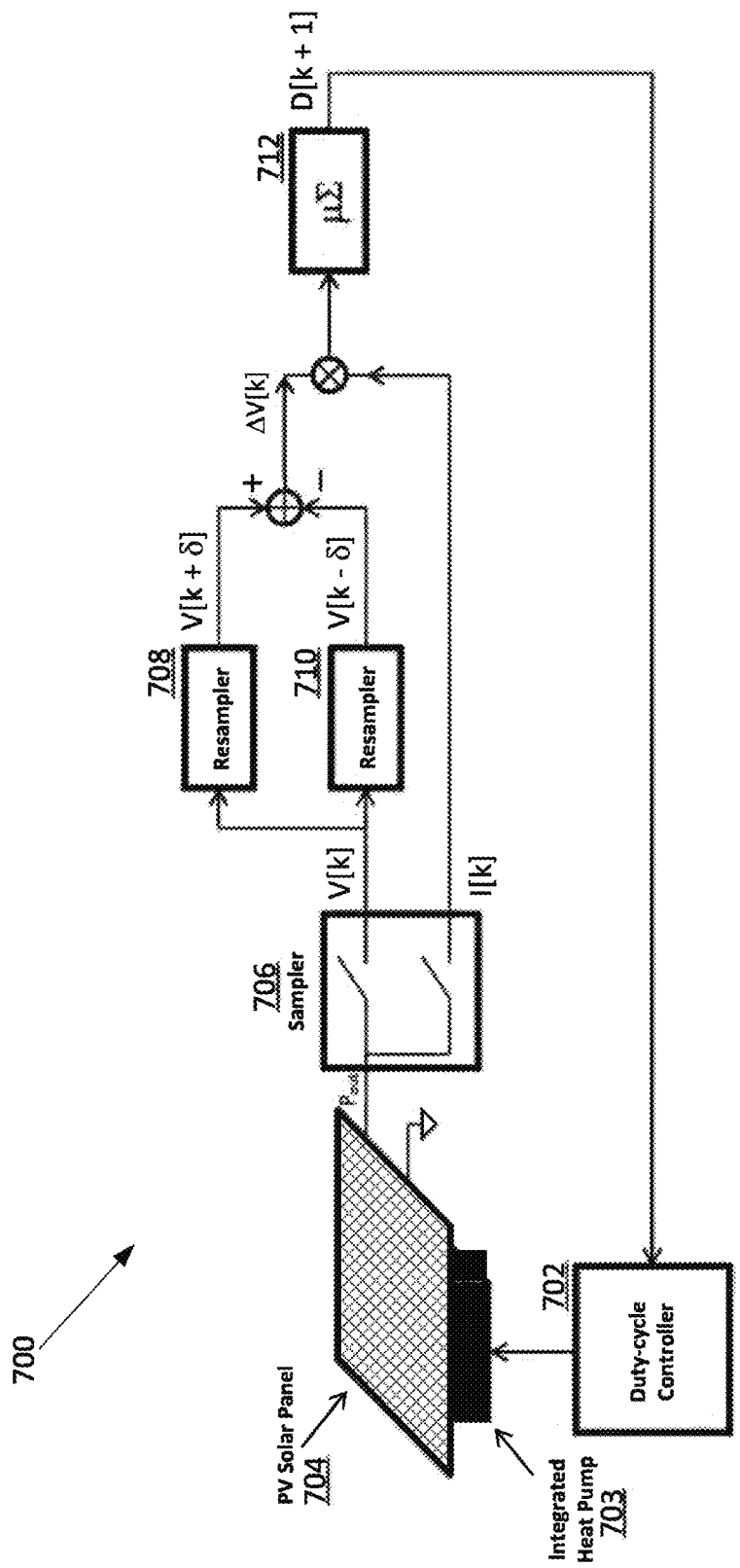
FIG. 7A illustrates an exemplary embodiment of a schematic representation of the adaptive, real-time, technique employed for updating the switching duty cycle of a self-cooled solar panel.
Figure 7C:
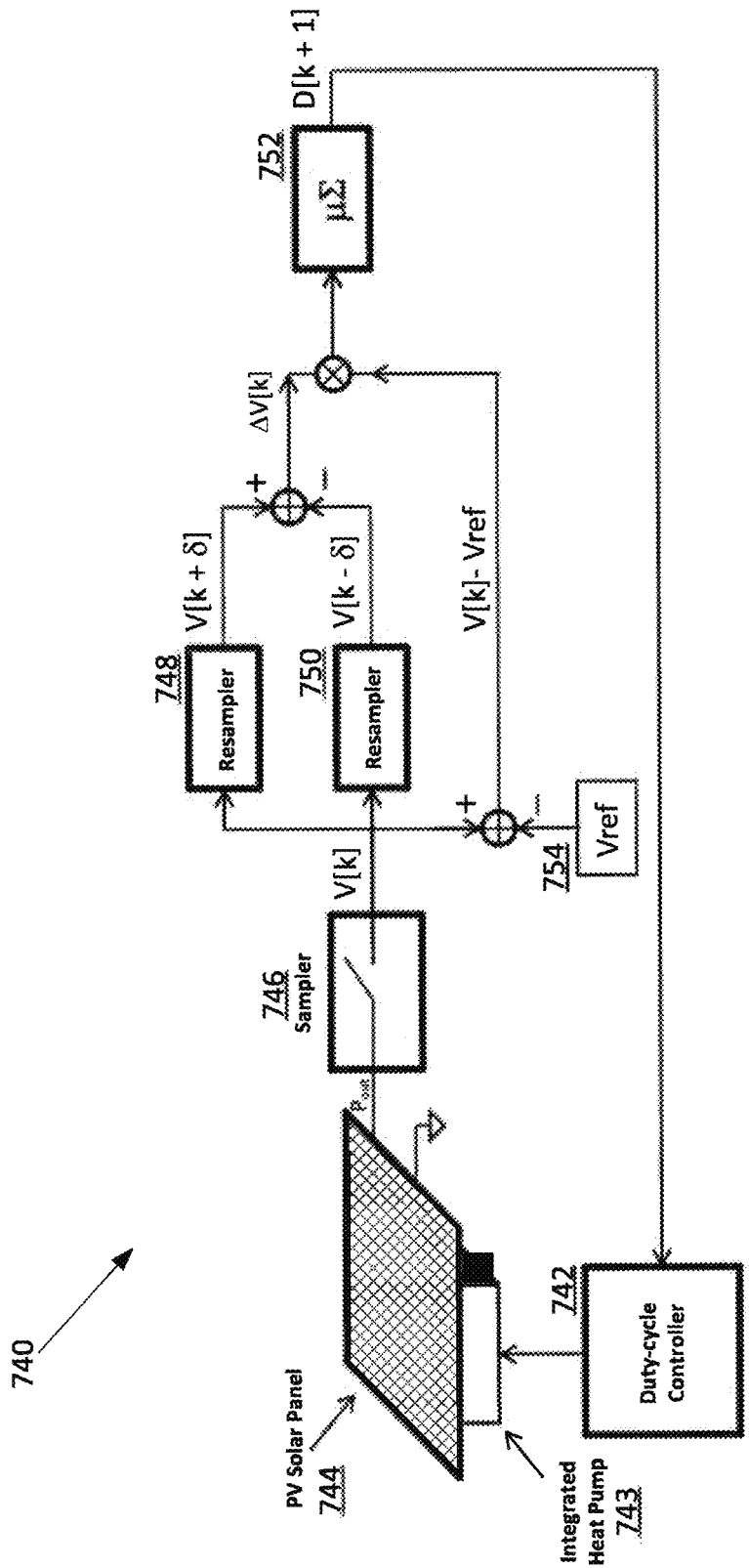
FIG. 7C illustrates an exemplary embodiment of yet another schematic representation of the adaptive, real-time, technique employed for updating the switching duty cycle of a self-cooled solar panel.

FIG. 7A illustrates an exemplary embodiment of a schematic representation 700 of the adaptive, real-time, technique employed for updating the switching duty cycle of a self-cooled solar panel. The technique may be based on a steepest descent approach. The diagram may show a case where the output power of the solar panel is employed as the objective function, which may be maximized by continually updating the switching duty-cycle, D.

In FIG. 7A, the output of duty-cycle controller 702 may be coupled to integrated heat pump 703. Integrated heat pump 703 may be associated with PV solar panel 704 that generates signal $P_{out}$, as illustrated in FIG. 7A. Signal $P_{out}$ may be sampled in sampler 706 to generate V[k] and I[k]. In turn, V[k] may be coupled to resampler 708 to generate V[k+$\delta$]. V[k] may also be coupled to resampler 710 to generate V[k−$\delta$]. The signals V[k+$\delta$] and V[k−$\delta$] may be combined to generate $\Delta$V[k]. In turn, $\Delta$V[k] may be combined with I[k] to provide an input to a function $\mu\Sigma$ 712. The output generated by function $\mu\Sigma$ 712 is D[k+1]. The signal D[k+1] may be coupled to an input of duty-cycle controller 702.

FIG. 7B illustrates an exemplary embodiment of another schematic representation 720 of the adaptive, real-time, technique employed for updating the switching duty cycle of a self-cooled solar panel. The technique may be based on a steepest descent approach. The diagram may a case where the square of the difference between the temperature of the solar panel and the ambient air temperature is employed as the objective function which may be minimized by continually updating the duty-cycle D.

FIG. 7B may have substantial similarity to FIG. 7A. FIG. 7B does include temperature sensors 734 that may allow the inclusion of ambient air temperature in determining the objective function. Referring to FIG. 7B, the output of duty cycle controller 722 may be coupled to integrated heat pump 723. Integrated heat pump 723 may be associated with PV solar panel 724 that generates signal $P_{out}$, as illustrated in FIG. 7B. PV solar panel 724 may include one or the temperature sensors 734 Signal $P_{out}$ may be sampled in sampler 726 to generate T[k]. In turn, T[k] may be coupled to resampler 728 to generate T[k+$\delta$]. T[k] may also be coupled to resampler 730 to generate T[k−$\delta$]. The signals T[k+$\delta$] and T[k−$\delta$] may be combined to generate $\Delta$T[k]. T[k] may also be combined to an output $T_{amp}$ of another of the temperature sensors 734 tand may generate T[k]−$T_{amp}$. In turn, $\Delta$T[k] may be combined with T[k]−$T_{amp}$ to provide an input to a function $\mu\Sigma$ 732. The output generated by function $\mu\Sigma$ 732 is D[k+1]. The signal D[k+1] may be coupled to an input of duty cycle controller 722.

FIG. 7C illustrates an exemplary embodiment of yet another schematic representation 740 of the adaptive, real-time, technique employed for updating the switching duty cycle of a self-cooled solar panel. The technique may be based on a steepest descent approach. The diagram may show a case where the square of the difference between the output voltage of the solar panel and a reference voltage is employed as the objective function which may be minimized by continually updating the duty-cycle, D. An appropriate choice for the reference voltage may be the open circuit voltage of the panel when the panel temperature is approximately equal to the ambient air temperature.

FIG. 7C may have substantial similarity to FIG. 7A. FIG. 7B does include a reference voltage, $V_{ref}$ 754, that may allow the inclusion of reference voltage, $V_{ref}$ 754, in determining the objective function. Referring to FIG. 7C, the output of duty-cycle controller 742 may be coupled to integrated heat pump 743. Integrated heat pump 743 may be associated with PV solar panel 744 that generates signal $P_{out}$, as illustrated in FIG. 7C. Signal $P_{out}$ may be sampled in sampler 746 to generate V[k]. In turn, V[k] may be coupled to resampler 748 to generate V[k+δ]. V[k] may also be coupled to resampler 750 to generate V[k−δ]. The signals V[k+δ] and V[k−δ] may be combined to generate ΔV[k]. V[k] may also be combined with $V_{ref}$ 754 to generate V[k]−$V_{ref}$ 754. In turn, ΔV[k] may be combined with $V_{ref}$ 754 to provide an input to a function μΣ 752. The output generated by function μΣ 752 is D[k+1]. The signal D[k+1] may be coupled to an input of duty-cycle controller 742.

FIG. 8A illustrates an exemplary embodiment of a schematic 800 showing details of electrical implementation of the switching mechanism shown in the self-cooled solar cell of FIG. 3. PV solar cell 804 may be associated with heat pump 806 and may be each coupled to switches S1 and S2. The switches, S1 and S2, may be implemented using power MOSFETs as shown in block 801. The switching frequency and duty cycle may be controlled by the voltages applied to the gate terminals of the MOSFETs. The circuitry may be employed to generate the gate drive signals shown in Switching Control Circuit 802. Two 555 timer ICs configured as a stable multi vibrators may be included as shown. The switching frequency may be determined by the values of resistor R2 and capacitor C1. Duty cycle may be controlled by the value of resistor R1. Schematic 800 includes power conditioner circuit 808 and load 810. Implementations of methods to adaptively vary R1 based on atmospheric conditions are shown in FIG. 8B and FIG. 8C.

FIG. 8B illustrates an exemplary embodiment of a schematic 820 showing details of electrical circuit employed to automatically vary the value of resistor R1 in the circuit of FIG. 8A, depending on the optimal duty cycle determined in software using the steepest descent technique. The value of resistor R1 may be measured between node A and node B of FIG. 8B.

In FIG. 8B, two temperature sensor thermocouple modules 822 may be placed to sense air temperature 824 and PV Cell temperature 826. The voltage outputs of the two temperature sensor thermocouple modules 822 may provide a measure of the air temperature 824 and PV Cell temperature 826. The voltages may be connected to the Analog-to-Digital (ADC) inputs of a microcontroller 828 (by way of example, but not limited to ATMEGA168).

As previously discussed, microcontroller 828 may comprise four digital outputs. The four digital outputs may be coupled to a circuit matrix 830 that comprises R1a, R1b, R1c, R1d and four MOSFETs. Microcontroller 828 may be programmed such that one out of four of its I/O (input/output) ports goes to digital level 0 depending on the difference between the sensed air temperature and PV Cell temperature as well as the heat pump's characteristics. The other three ports may remain at digital level 1. Furthermore, these four I/O ports may be connected to the gates of four p-channel MOSFETs. Thus, the p-MOSFET whose gate voltage is at digital level 0 may be ON while the other three may be OFF. Consequently, the resistor R1a or R1b or R1c or R1d, whichever is connected in series with the p-MOSFET may be the effective resistance between nodes A and B. Using circuit matrix 830 in place of the variable resistor R1 shown in FIG. 8A may provide a mechanism to automatically control the switching duty cycle D and thereby the temperature of the PV Cells, using its own energy.

FIG. 8C illustrates an exemplary embodiment of another schematic 840 showing details of electrical circuit that predictively and automatically varies the value of resistor R1 of the circuit of FIG. 8A, depending not only on the currently prevailing air temperature and PV Cell temperature, but also on forecasted weather conditions. Information about the forecasted atmospheric conditions may be acquired by using a Wi-Fi capable microcontroller 848 (by way of example, but not limited to ESP8266) that may be programmed to receive such information from a dedicated website.

Schematic 840 includes the functional elements of schematic 820 and additionally includes the Wi-Fi functionality. Specifically, schematic 840 comprises two temperature sensor thermocouple modules 842 that may be placed to sense air temperature 824 and PV Cell temperature 846. The voltage outputs of the two temperature sensor thermocouple modules 842 may provide a measure of the air temperature 844 and PV Cell temperature 846. The voltages may be connected to the Analog-to-Digital (ADC) inputs of a Wi-Fi capable microcontroller 848. Wi-Fi capable microcontroller 848 may comprise four digital outputs. The four digital outputs may be coupled to a circuit matrix 850. The functionality of schematic 840 may be equivalent to schematic 820 except that the Wi-Fi capable microcontroller 848 may receive Wi-Fi signal 852.

FIG. 9 illustrates an exemplary embodiment of a section of c code 900 for programming microcontroller for automatically adjusting duty cycle, and thereby the PV Cell temperature, under varying atmospheric conditions. This section of the code may show how the various bits of the output port are made to change depending on the difference between air temperature and PV Cell temperature.

Figure 10:
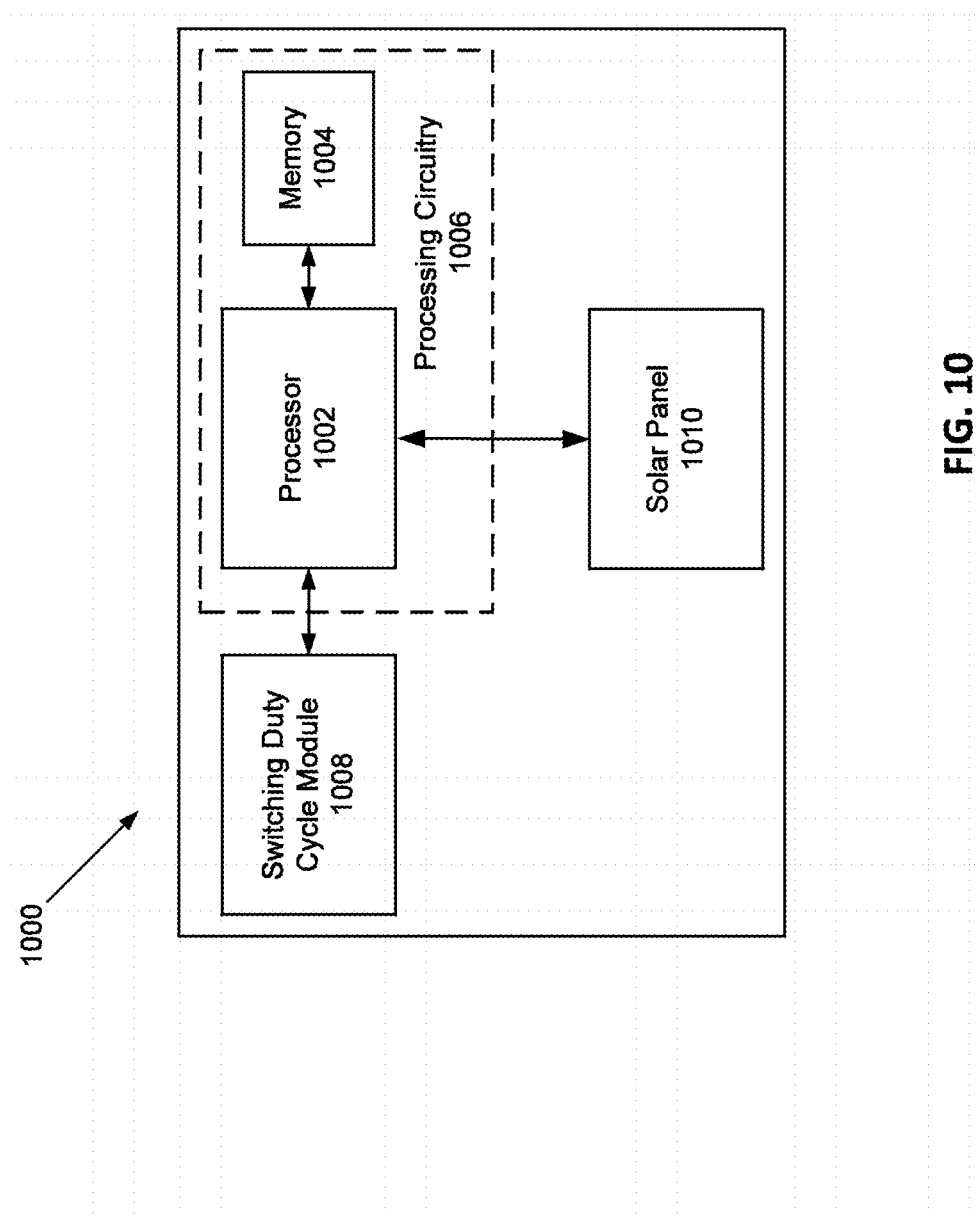

FIG. 10 illustrates a block diagram of an apparatus 1000 that may be a portion of a smart hybrid solar panel, in according with some embodiments. The apparatus of FIG. 10 may be configured to perform self-powered adaptive temperature control, in accordance with one or more embodiments. It will be appreciated that the components, devices or elements illustrated in and described with respect to FIG. 10 may not be mandatory and thus some may be omitted in certain embodiments. Additionally, some embodiments may include further or different components, devices or elements beyond those illustrated in and described with respect to FIG. 10.

In some example embodiments, the apparatus 1000 may include processing circuitry 1006 that is configurable to perform actions in accordance with one or more embodiments disclosed herein. In this regard, the processing circuitry 1006 may be configured to perform and/or control performance of one or more functionalities of the apparatus 1000 in accordance with various embodiments, and thus may provide means for performing functionalities of the apparatus 1000 in accordance with various embodiments. The processing circuitry 1006 may be configured to perform data processing, application execution and/or other processing and management services according to one or more embodiments.

In some embodiments, the apparatus 1000 or a portion(s) or component(s) thereof, such as the processing circuitry 1006, may include one or more chipsets, which may each include one or more chips. The processing circuitry 1006 and/or one or more further components of the apparatus 1000 may therefore, in some instances, be configured to implement an embodiment on a chipset comprising one or more chips. In some example embodiments in which one or more components of the apparatus 1000 are embodied as a chipset, the chipset may be capable of enabling a computing device, e.g., and without limitations, a smart hybrid solar panel, when implemented on or otherwise operably coupled to the computing device.

The processor 1002 may be embodied in a variety of forms. For example, the processor 1002 may be embodied as various processing hardware-based means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 1002 may comprise a plurality of processors. The plurality of processors may be in operative communication with each other and may be collectively configured to perform one or more functionalities of the apparatus 1000 as described herein. In some embodiments, the processor 1002 may be configured to execute instructions that may be stored in the memory 1004 or that may be otherwise accessible to the processor 1002. As such, whether configured by hardware or by a combination of hardware and software, the processor 1002 may be capable of performing operations according to various embodiments while configured accordingly.

In some embodiments, the memory 1004 may include one or more memory devices. Memory 1004 may include fixed and/or removable memory devices. In some embodiments, the memory 1004 may provide a non-transitory computer-readable storage medium that may store computer program instructions that may be executed by the processor 1002. In this regard, the memory 1004 may be configured to store information, data, applications, instructions and/or the like for enabling the apparatus 1000 to carry out various functions in accordance with one or more example embodiments. In some embodiments, the memory 1004 may be in communication with one or more of the processor 1002, solar panel 1010, or switching duty cycle module 1008 via one or more busses for passing information among components of the apparatus 1000.

The apparatus 1000 may further include solar panel 1010. The solar panel 1010 may be configured to enable the apparatus 1000 to provide active temperature regulation that may be implemented using a heat pump such as, and without limitations, thermoelectric (TE) cooling modules and a switching circuit with variable duty cycle that periodically diverts the photovoltaic solar cell's output to the heat pump. A smart software defined control system based on switching duty cycle module 1008 may algorithmically adjust the switching duty cycle to maximize the net power output of the panel based on a variety of sensory inputs and/or algorithms The apparatus 1000 may further include switching duty cycle module 1008. The switching duty cycle module 1008 may be embodied as various means, such as circuitry, hardware, a computer program product comprising computer readable program instructions stored on a computer readable medium (for example, the memory 1004) and executed by a processing device (for example, the processor 1002), or some combination thereof. In some embodiments, the processor 1002 (or the processing circuitry 1006) may include, or otherwise control the switching duty cycle module 1008. The switching duty cycle module 1008 may be configured to perform and/or otherwise control adaptive updating of the switching duty cycle, in accordance with one or more embodiments disclosed herein.

In summary, by way of example, and without limitations, embodiments of the present invention disclose an adaptive manner in which the heat pump of the self-cooled solar panel may be controlled. First, a controller may be aware of the present state of the solar panel in terms of its temperature and output power and based on sensor inputs the controller and may decide how to adjust the cooling power of the heat pump to maximize the output of the solar panel. As a result, the system may work optimally under various environmental conditions. Second, the decision element of the control system may be essentially implemented in software. As a result, multiple and different control algorithms maybe coded without any hardware modifications. Third, because of the software defined nature of the device, it may be possible to have the device networked, allowing future forecasted atmospheric conditions to be employed in its decision making algorithm, and giving the system predictive capability. Fourth, the steepest descent optimization technique, which may be employed in embodiments of the present invention, essentially represents a linear time-invariant system, which may be made unconditionally stable (unlike other controllers that may go into unstable/oscillatory modes). Lastly, a single controller unit may be employed to control a large array of solar panels by simply monitoring the state of each panel.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, embodiments of the present invention are not limited to any particular tangible means of implementation.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112 (6) when such corresponding structures are not explicitly disclosed in the foregoing patent specification. Therefore, for any invention element(s)/structure(s) corresponding to functional claim limitation(s), in the below claims interpreted under 35 USC § 112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing methods and apparatus to increase in the power output of solar panels according to embodiments of the present invention will be apparent to those skilled in the art. Various aspects of the invention have been described above by way of illustration, and the specific embodiments disclosed are not intended to limit the invention to the particular forms disclosed. The particular implementation of the methods and apparatus to increase in the power output of solar panels may vary depending upon the particular context or application. Embodiments of the present invention may be implemented as an "add-on" for commercially available photovoltaic solar panels. By way of example, and without limitations, the methods and apparatus to increase in the power output of solar panels described in the foregoing were principally directed to solar energy implementations; however, similar techniques may instead be applied to a variety of internet of things (IoT) applications, which embodiments of the present invention are contemplated as within the scope of the present invention. Additionally, any product or process that may require or could benefit from adaptive control technologies and features may benefit from one or more embodiments of the present invention. The implementations may be based on hardware or software, or a combination thereof. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. Embodiments of the present invention have been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any or essential features of the claimed subject matter. It is submitted with the understanding that it will not be used to limit or interpret the scope or meaning of the claims.

The following claims are hereby incorporated into the detailed description, with each claim standing on its own as a separate embodiment.

What is claimed is:

1. A method comprising:
sampling one or more input parameters;
estimating a gradient of a power output of a solar panel with an integrated heat pump relative to a current switching duty cycle of said solar panel, in which said estimation is based said sample input parameters; and
generating an updated switching duty cycle by subtracting (i) said gradient of said power output relative to said current switching duty cycle times a step size from (ii) said current switching duty cycle.

2. The method as recited in claim 1, further comprising initially setting a 100% switching duty cycle, in which said solar panel is constantly supplying power to a load, while no power is being diverted to said integrated heat pump.

3. The method as recited in claim 1, further comprising not updating said current switching duty cycle if said gradient of said power output relative to said current switching duty cycle of said solar panel is equal to zero.

4. The method as recited in claim 1, further comprising, after generating said updated switching duty cycle, repeating said estimation of said gradient of said power output relative to said current switching duty cycle of said solar panel based on said updated switching duty cycle.

5. The method as recited in claim 1, in which continually updating said current switching duty cycle maximizes said power output delivered by said solar panel.

6. The method as recited in claim 1, in which said one or more input parameters comprise a panel voltage, an output current, humidity and/or temperatures.

7. The method as recited in claim 1, in which said estimation of said gradient of said power output of said solar panel relative to said current switching duty cycle of said solar panel is determined by re-sampling a solar panel voltage and solar panel output current at various increments of said current switching duty cycle, and numerically estimating said gradient.

8. A non-transitory computer-readable storage medium with an executable program stored thereon, wherein the program instructs one or more processors to perform the following steps:
sampling one or more input parameters;
estimating a gradient of a power output of a solar panel with an integrated heat pump relative to a current switching duty cycle of said solar panel, in which said estimation is based said sample input parameters; and
generating an updated switching duty cycle by subtracting (i) said gradient of said power output relative to said current switching duty cycle times a step size from (ii) said current switching duty cycle.

9. The program instructing the one or more processors as recited in claim 8, further comprising the step of initially setting a 100% switching duty cycle, in which said solar panel is constantly supplying power to a load, while no power is being diverted to said integrated heat pump.

10. The program instructing the one or more processors as recited in claim 8, further comprising the step of not updating said current switching duty cycle if said gradient of said power output relative to said current switching duty cycle of said solar panel is equal to zero.

11. The program instructing the one or more processors as recited in claim 8, further comprising the step of repeating said estimation of said gradient of said power output relative to said current switching duty cycle of said solar panel based on said updated switching duty cycle after generating said updated switching duty cycle.

12. The program instructing the one or more processors as recited in claim 8, in which repeating said generation of updated switching duty cycles causes changes to a fraction of an output power of said solar panel that is diverted to a cooling unit of said solar panel.

13. The program instructing the one or more processors as recited in claim 8, in which said estimation of said gradient of said power output of said solar panel relative to said current switching duty cycle of said solar panel is determined by re-sampling a solar panel voltage and solar panel output current at various increments of said current switching duty cycle, and numerically estimating said gradient.

14. The program instructing the one or more processors as recited in claim 8, further comprising selecting said step size to obtain a steepest descent gradient.

* * * * *